United States Patent
Wu et al.

(10) Patent No.: US 10,957,664 B2
(45) Date of Patent: Mar. 23, 2021

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Tung-Jiun Wu, Hsinchu County (TW); Mingni Chang, Hsinchu (TW); Ming-Yih Wang, Hsin-Chu (TW); Yinlung Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/425,538

(22) Filed: May 29, 2019

(65) Prior Publication Data
US 2020/0381378 A1  Dec. 3, 2020

(51) Int. Cl.
*H01L 23/00* (2006.01)
(52) U.S. Cl.
CPC .............. *H01L 24/05* (2013.01); *H01L 24/03* (2013.01); *H01L 24/11* (2013.01); *H01L 24/13* (2013.01); *H01L 2224/0226* (2013.01); *H01L 2224/02235* (2013.01); *H01L 2224/02251* (2013.01); *H01L 2224/02255* (2013.01);
(Continued)
(58) Field of Classification Search
CPC ......... H01L 2224/05; H01L 2224/0212; H01L 2224/02122; H01L 2224/02125; H01L 2224/0214; H01L 2224/0215; H01L 2224/02165; H01L 2224/0218; H01L 2224/022; H01L 2224/02205; H01L 2224/021; H01L 2224/02215; H01L 2224/20033; H01L 2224/02235; H01L 2224/0225; H01L 2224/02255; H01L 2224/0226; H01L 2224/03019; H01L 2224/0401; H01L 2224/0509; H01L 2224/1012; H01L 2224/10122; H01L 2224/10125; H01L 2224/11019; H01L 2224/0391; H01L 2224/03916; H01L 2224/1148; H01L 2224/2748; H01L 2224/05083; H01L 2224/05084; H01L 2224/02126; H01L 2224/02166; H01L 21/282477; H01L 2924/35;
(Continued)

(56) References Cited

U.S. PATENT DOCUMENTS 6,297,140 B1 * 10/2001 Uzoh .................. H01L 24/03
  257/E21.508
6,667,230 B2 * 12/2003 Chen .................. H01L 24/03
  257/E21.508
(Continued)

*Primary Examiner* — David A Zarneke
(74) *Attorney, Agent, or Firm* — WPAT, P.C., Intellectual Property Attorneys; Anthony King

(57) ABSTRACT

A semiconductor structure and manufacturing method thereof are provided. The semiconductor structure includes a metallization structure with a dielectric surface. A first protecting structure is on the dielectric surface. A conductive pad is on the dielectric surface and is leveled with the first protecting structure. A polymer layer is over the first protecting structure and the conductive pad. A conductive bump is electrically coupled to the conductive pad through an opening of the polymer layer. A method for manufacturing a semiconductor structure is also provided.

20 Claims, 23 Drawing Sheets

(52) U.S. Cl.
CPC ............... *H01L 2224/03614* (2013.01); *H01L 2224/0401* (2013.01); *H01L 2224/05018* (2013.01); *H01L 2224/13026* (2013.01); *H01L 2224/13147* (2013.01); *H01L 2924/07025* (2013.01); *H01L 2924/3512* (2013.01)

(58) Field of Classification Search
CPC ....... H01L 2924/351; H01L 2924/3511; H01L 2924/3512
See application file for complete search history.

(56) References Cited

U.S. PATENT DOCUMENTS

| | | | | |
|---|---|---|---|---|
| 7,271,030 B2* | 9/2007 | Bojkov | .................... | H01L 24/05 438/107 |
| 7,323,406 B2* | 1/2008 | Lim | .................. | H01L 21/76834 257/E21.503 |
| 7,326,629 B2* | 2/2008 | Nagarajan | ......... | H01L 21/76898 257/E21.597 |
| 7,829,450 B2* | 11/2010 | Hammer | ................ | H01L 24/05 438/612 |
| 7,885,564 B2* | 2/2011 | Handa | .................. | G03G 15/065 399/55 |
| 8,283,781 B2* | 10/2012 | Wu | ......................... | H01L 24/11 257/738 |
| 8,587,119 B2* | 11/2013 | Hwang | ................... | H01L 24/05 257/737 |
| 8,786,082 B2* | 7/2014 | Shen | ................. | H01L 23/49811 257/737 |
| 8,822,324 B2* | 9/2014 | Goebel | ................... | H01L 24/11 438/612 |
| 9,754,905 B1* | 9/2017 | Misra | ....................... | H01L 24/03 |
| 9,780,052 B2* | 10/2017 | Mariottini | ............... | H01L 24/13 |
| 9,786,593 B1* | 10/2017 | Lin | ......................... | H01L 24/13 |
| 9,905,522 B1* | 2/2018 | Lin | ......................... | H01L 24/05 |
| 10,483,232 B2* | 11/2019 | Hsu | ..................... | H01L 23/5383 |
| 2004/0007779 A1* | 1/2004 | Arbuthnot | ............... | H01L 24/13 257/780 |
| 2004/0157450 A1* | 8/2004 | Bojkov | .................... | H01L 24/03 438/689 |
| 2007/0075423 A1* | 4/2007 | Ke | .......................... | H01L 24/03 257/737 |
| 2008/0194095 A1* | 8/2008 | Daubenspeck | ..... | H01L 23/3192 438/612 |
| 2019/0027453 A1* | 1/2019 | Kim | ....................... | H01L 24/05 |
| 2020/0035631 A1* | 1/2020 | Chang | .................... | H01L 24/05 |
| 2020/0083186 A1* | 3/2020 | Nelson | .................. | H01L 24/03 |

* cited by examiner

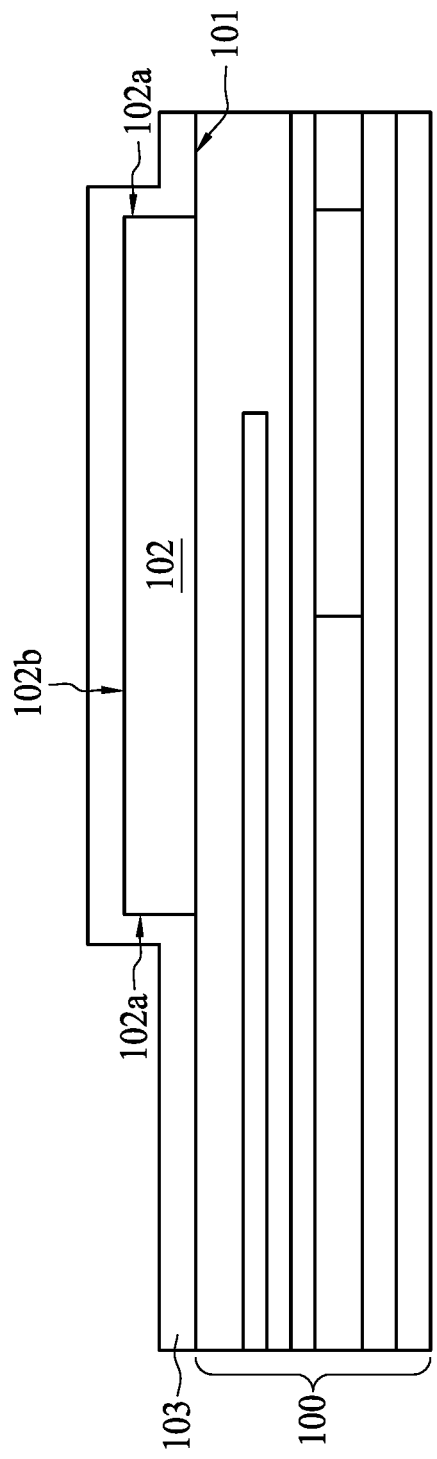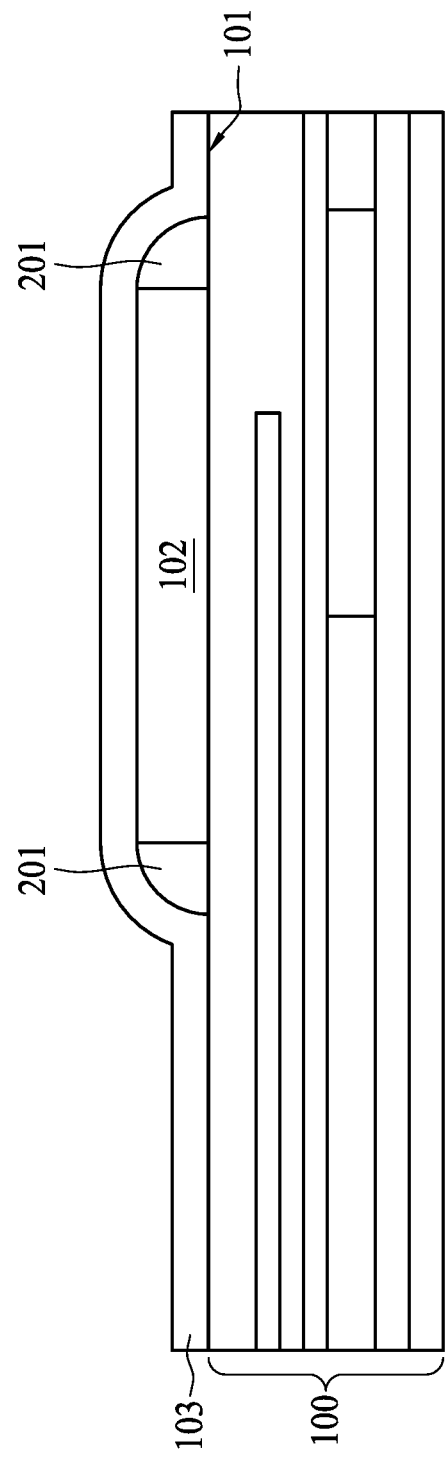
FIG. 2A
FIG. 2B

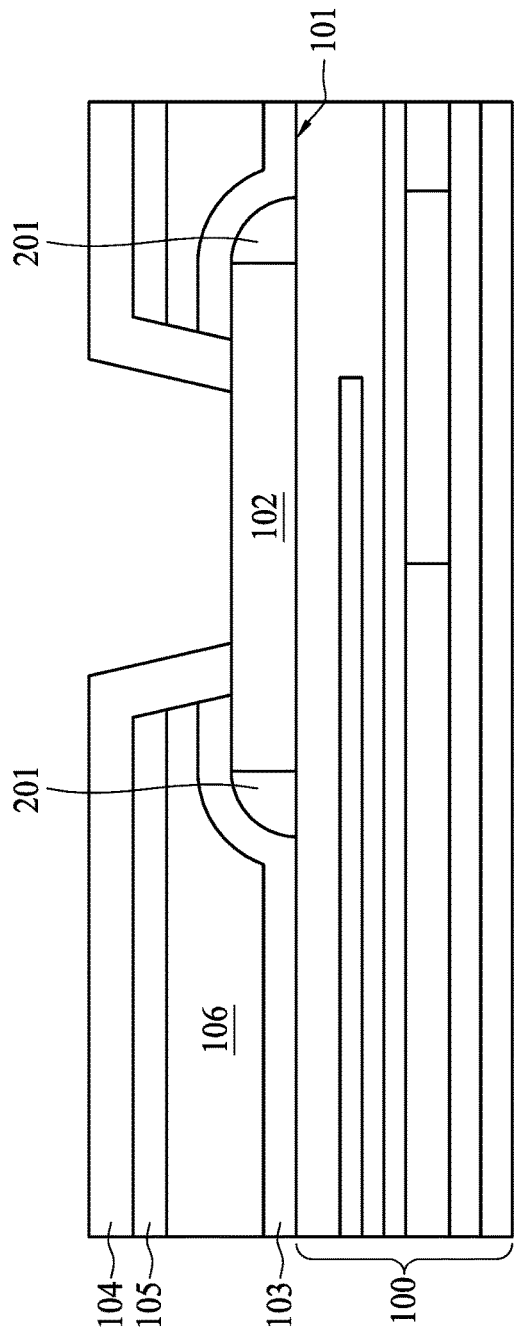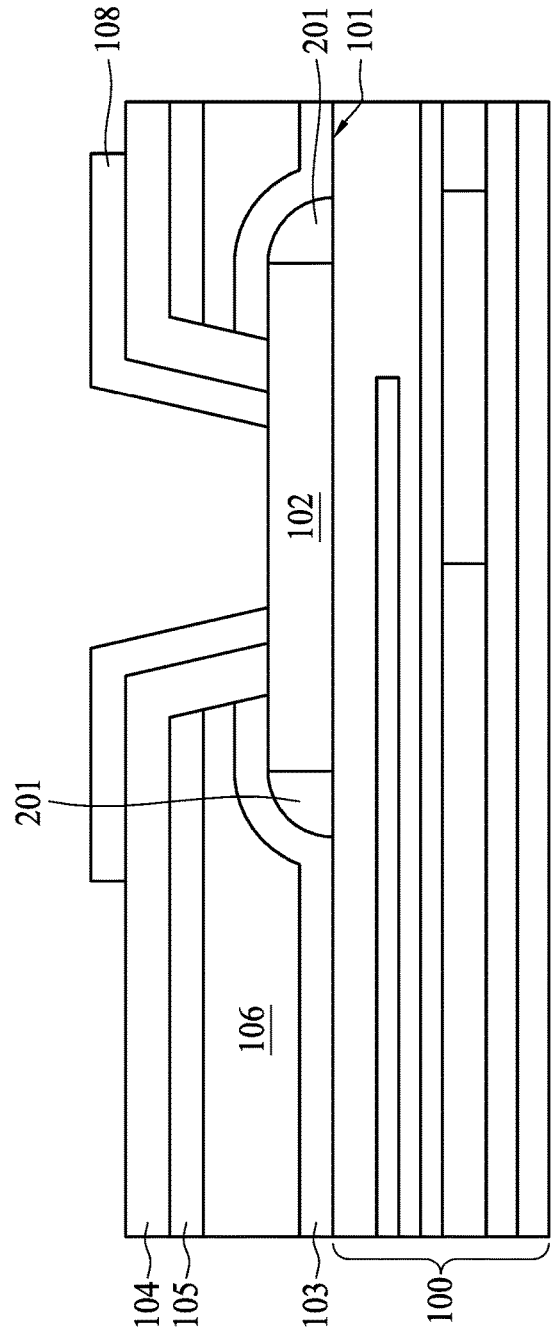

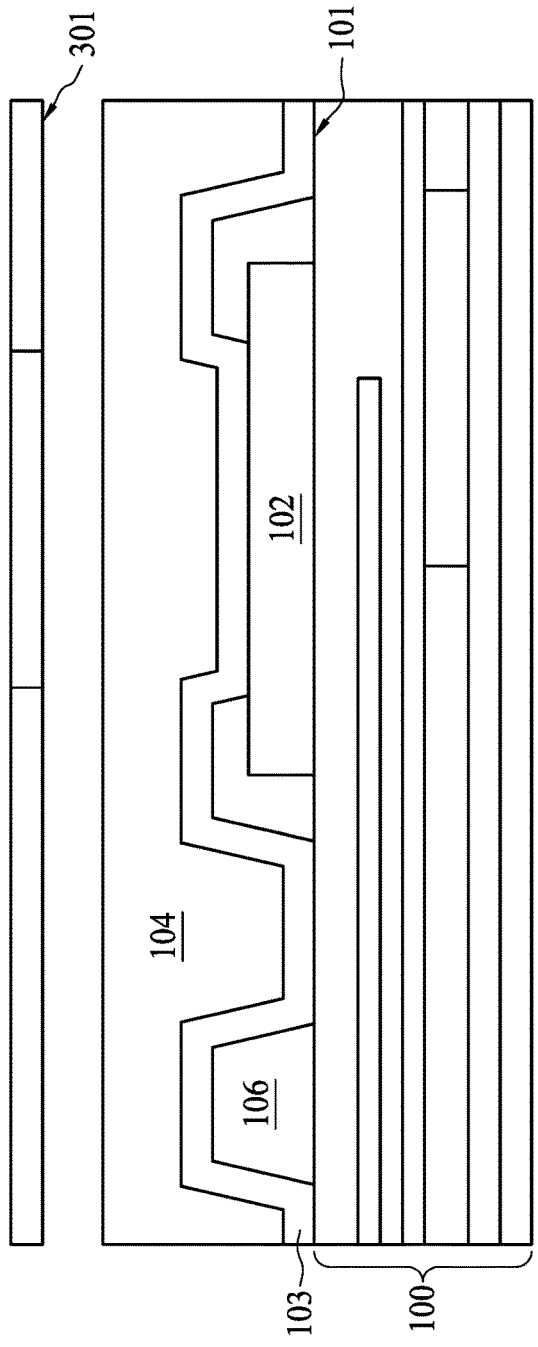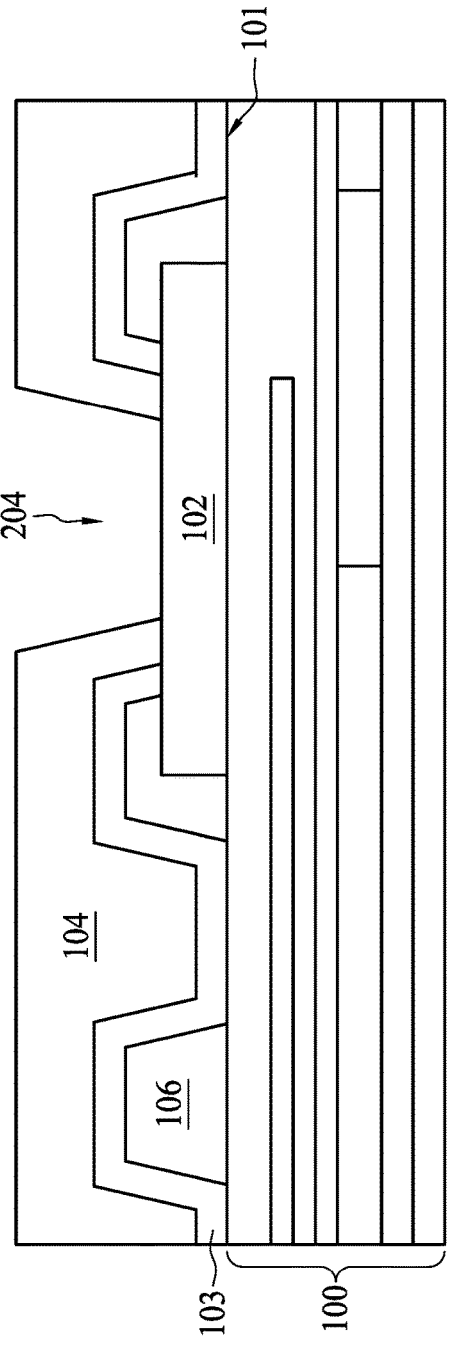

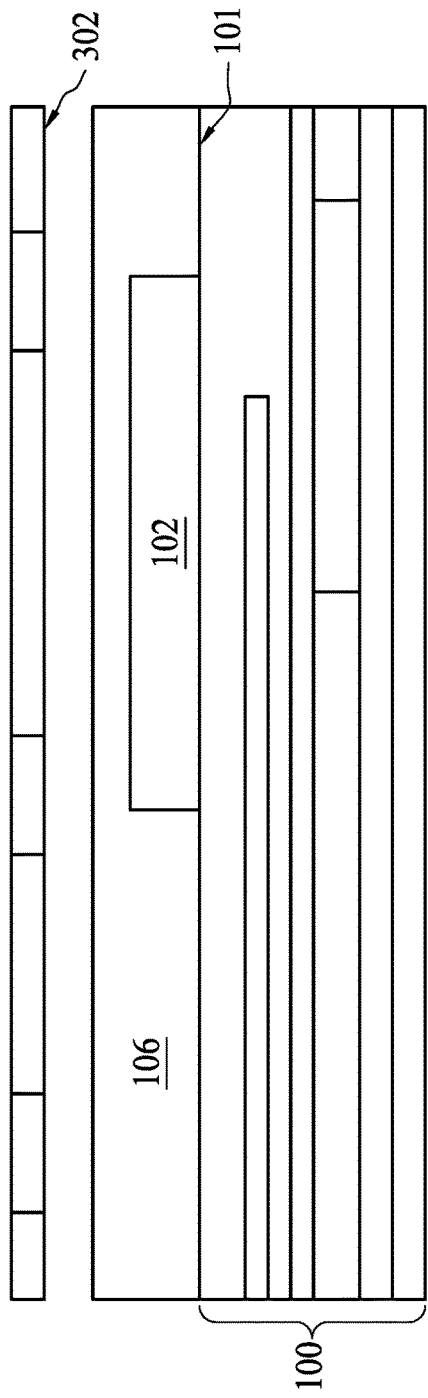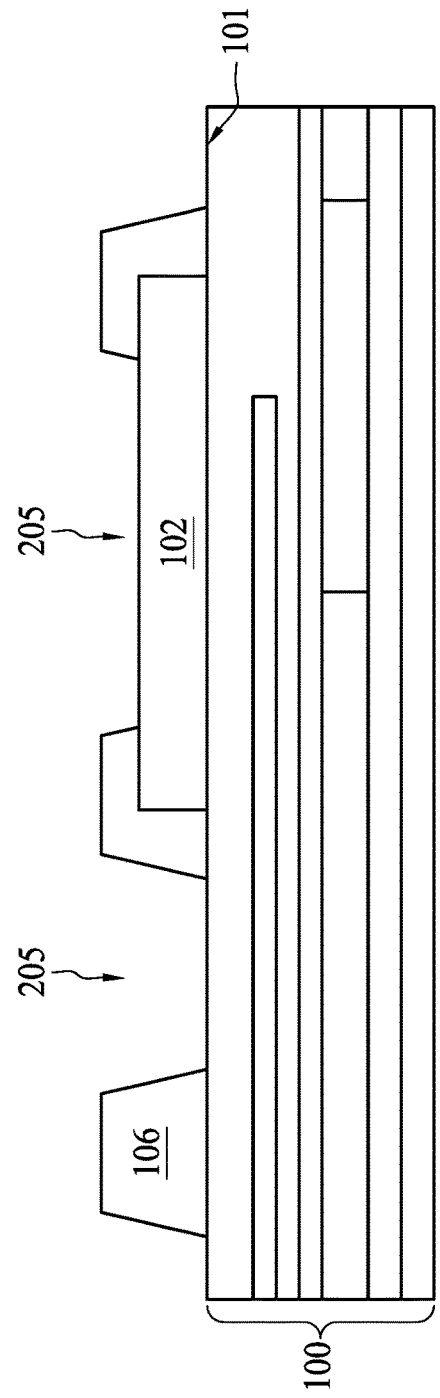

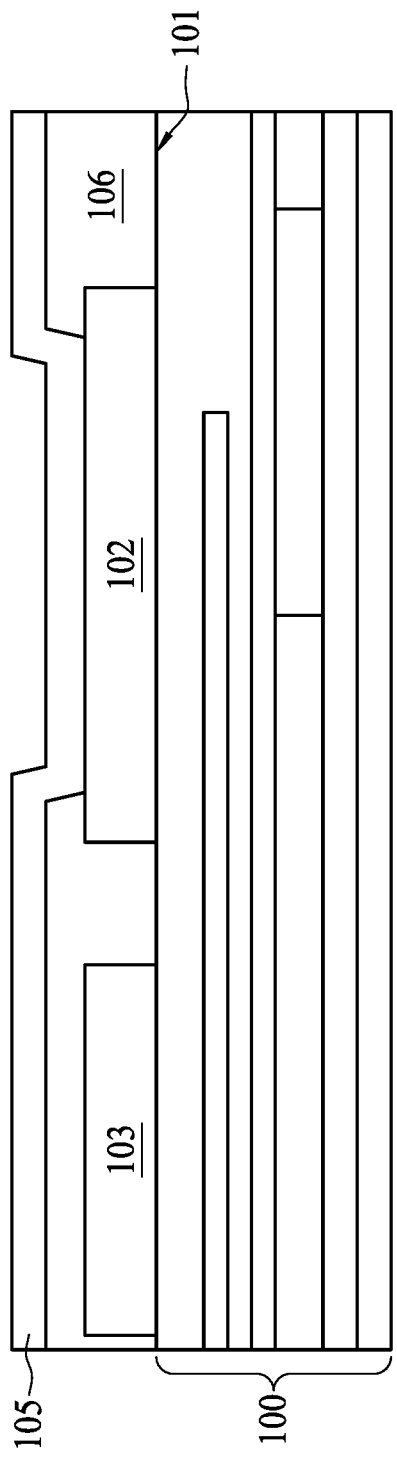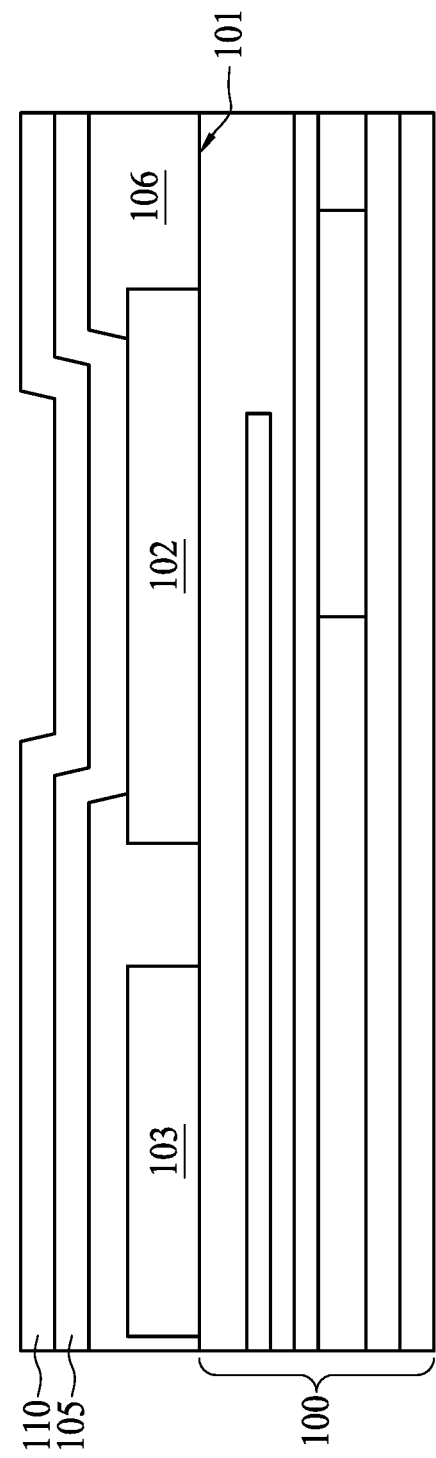

SEMICONDUCTOR STRUCTURE AND MANUFACTURING METHOD THEREOF

FIELD

The present disclosure is related to a semiconductor structure and, more particularly, to a semiconductor structure with a protecting structure between a metallization structure and a conductive bump.

BACKGROUND

Microelectronic semiconductor IC devices such as Complementary Metal Oxide Semiconductor Field Effect Transistor (CMOS FET) devices and the like are manufactured in a complex process in which numerous separate electronic devices are formed. Such processes of manufacture, which produce large numbers of such electronic devices, are referred to as Very Large Scale Integration (VLSI) processes. After many processing steps, conductive terminals such copper bumps and/or solder bumps are to be disposed over interconnect structure during the Back End of Line (BEOL) process.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 2A and 2B illustrate cross-sectional views of first protecting structures according to some embodiments of the present disclosure.

FIGS. 3A to 3F illustrate cross-sectional views at various operations of manufacturing a semiconductor structure according to some embodiments of the present disclosure.

FIGS. 4C to 4J illustrate cross-sectional views at various operations of manufacturing a semiconductor structure according to some embodiments of the present disclosure.

FIGS. 5A and 5B illustrate cross-sectional views at various operations of manufacturing a semiconductor structure according to some embodiments of the present disclosure.

FIGS. 8A to 8F illustrate cross-sectional views at various operations of manufacturing a semiconductor structure according to some embodiments of the present disclosure.

DETAILED DESCRIPTION

Figure 1:
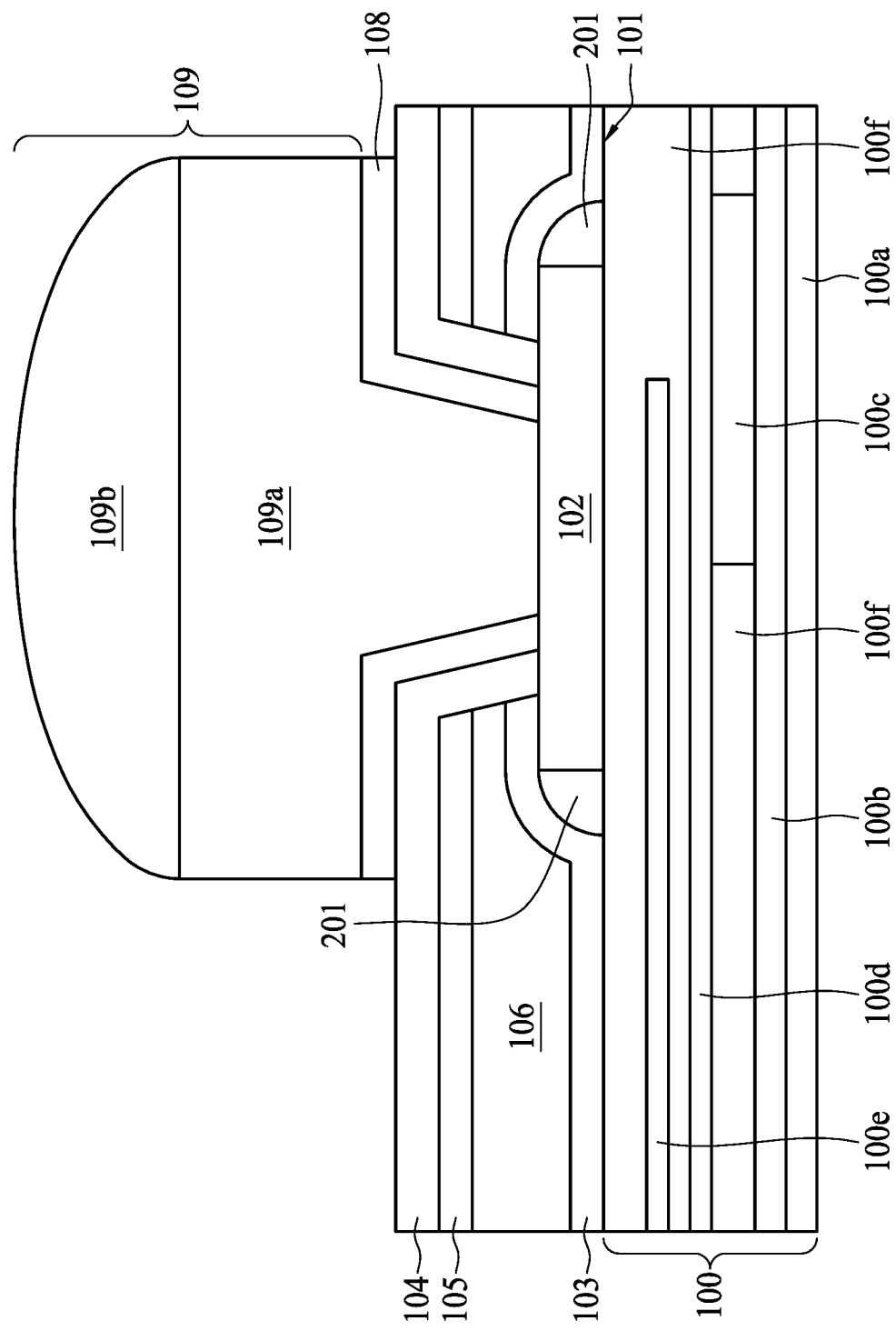
FIG. 1 illustrates a cross-sectional view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Chip packaging interaction (CPI) may introduce mechanical stress to components in the chip. Such interaction is between the semiconductor package and the semiconductor chip, and the stress generated in the package may be caused by thermal, mechanical and chemical mechanisms. For instance, when it is widely used to implement extreme low K (ELK) dielectric materials (k<2.5) into the BEOL of a semiconductor chip to reduce the interconnect capacitance and crosstalk noise and enhance circuit performance, the lower mechanical strength of the ELK layer, along with increased die size, difference in effective coefficient of thermal expansion (CTE) between die and substrate, and the use of higher stiffness lead-free solder, all may bring the outcome of cracking at the ELK layer. Also, the bonding pressure from the copper bump to the aluminum copper bonding pad may increase the stress suffered by the chip, and consequently, the structures inside the chip such as passivation layers, metal-insulator-metal (MIM) structure, and ELK layer, may be cracked and result in device failure.

Accordingly, CPI has become one of the critical reliability issues during the BEOL operations. Feasible approaches are required to prevent the underlying ELK layer, MIM structure, or even the metallization/interconnect structure in the chip from cracking by providing an effective protecting structure to reduce the impact.

Mechanical stress may be induced by CPI and thus damage the chip due to the bonding pressure delivered from the conductive bump to the conductive pad. Typically, the damage may be manifested as cracking within the chip at the structures fabricated during BEOL operations, especially the passivation layers, metal-insulator-metal (MIM) device, and extreme low K (ELK) layer below the conductive pad. In the present disclosure, as one of the embodiments shown in FIG. 1, at least a protecting structure is disposed on the dielectric surface of the metallization structure. Meanwhile, the protecting structure is leveled with the conductive pad. Accordingly, the mechanical stress originates from chip packaging interaction may be prevented from applying on the structures or elements below the conductive pad.

As shown in FIG. 1, the semiconductor structure of the present disclosure includes a metallization structure 100 having a dielectric surface 101, a first protecting structure 103, a conductive pad 102, a polymer layer 104, and a conductive bump 109.

The metallization structure 100 includes a series of stacked layers over a substrate (e.g. silicon wafer). The stacked layers are fabricated to provide individual devices (transistors, capacitors, resistors, etc.) get interconnected with metal wiring on the substrate. Accordingly, adjacent layers in the metallization structure 100 are linked together through the use of electrical contacts and vias. In some embodiments, the metallization structure 100 may be a multilayer structure includes an extreme low-k (ELK) dielectric layer 100a, a via 100b, a metal line 100c laterally surrounded by a dielectric material 100f, an etch-stop layer 100d, and a metal insulator metal (MIM) device 100e stacked respectively. The ELK dielectric layer 100a may be a layer with dielectric constant (k) less than about 2.5, such as SiOC, SiOCN and SiCOH. In some embodiments, the MIM device 100e is covered by dielectric material 100f such as undoped silicate glass (USG) or fluorinated silicate glass (FSG) for enhanced structural stability. The etch-stop layer 100d may include the dielectric material such as silicon nitride, silicon dioxide, or carbon-doped silicon nitride. In some embodiments, the metallization structure 100 is a back end of line (BEOL) structure or the devices thereof.

The conductive pad 102 is disposed on the dielectric surface 101 of the metallization structure 100. The conductive pad 102 may be made by any suitable conductive material includes but not limited to metal (e.g., copper, tantalum, titanium, molybdenum, tungsten, platinum, aluminum, hafnium, ruthenium), metal silicide (e.g., titanium silicide, cobalt silicide, nickel silicide, tantalum silicide), or metal nitride (e.g., titanium nitride, tantalum nitride). In some embodiments, the conductive pad 102 is formed by chemical vapor deposition (CVD), low pressure chemical vapor deposition, physical vapor deposition (PVD), atomic layer deposition, or spin-on.

In some embodiments, the first protecting structure 103 is disposed on the dielectric surface 101 and leveled with the conductive pad 102. For example, a bottom of the first protecting structure 103 and a bottom of the conductive pad 102 are disposed on the dielectric surface 101. The first protecting structure 103 may be composed of silicon nitride or silicon oxide with a thickness of from about 2000 Å to about 3000 Å. When the ELK dielectric material is disposed above and under the first protecting structure 103, an oxide-nitride-oxide (ONO) stack may be formed. Considering the lattice mismatch between oxide and nitride, the aforesaid thickness range of the first protecting structure 103 may minimize the stress caused by lattice mismatch in ONO stack. In some embodiments, the first protecting structure 103 is formed by chemical vapor deposition (CVD), plasma-enhanced CVD, spin-on, or other applicable methods. As shown in FIG. 2A, in some embodiments, the first protecting structure 103 is disposed on the dielectric surface 101 and the conductive pad 102, and therefore the sidewalls 102a and the top surface 102b of the conductive pad 102 are covered by the first protecting structure 103. In some embodiments, as shown in FIG. 2B, before forming the first protecting structure 103, the spacers 201 are formed on the sidewalls 102a of the conductive pad 102. In some embodiments, the spacers 201 are made of silicon oxide, silicon nitride, silicon oxynitride, or other applicable material. In some embodiments, the spacers 201 are shaped by blanket-etching after disposed by chemical vapor deposition (CVD), plasma enhanced CVD, sputter, spin-on, or physical vapor deposition (PVD), or other applicable methods.

In consider the mechanical stress originated form chip packaging interaction are mainly applied to the areas close to the conductive bump, in some embodiments, the present disclosure enhances the structure strength of the peripheral areas of the conductive pad 102 by the spacers 201 and further resisting and dispersing the mechanical stress by the first protecting structure 103, and the mechanical stress exerted to the structures below the dielectric surface 101 may be reduced.

Figure 3A:
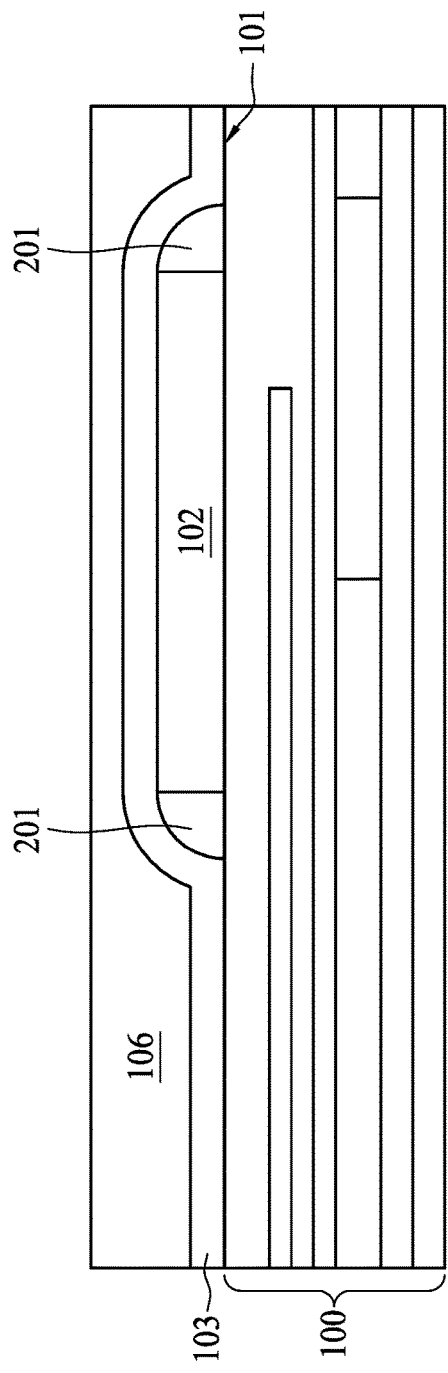

As shown in FIG. 3A, in some embodiments, a passivation layer 106 is disposed on the first protecting structure 103 after forming thereof. The passivation layer 106 may be made of undoped silicate glass (USG), silicon oxynitride, phosphosilicate glass (PSG), borophosphosilicate glass (BPSG), fluorinated silicate glass (FSG), organosilicate glasses (OSG), SiOxCy, Spin-On-Glass, or the like. In some embodiments, the passivation layer 106 is formed by high density plasma (HDP), chemical vapor deposition (CVD), plasma enhanced CVD, sputter, spin-on, physical vapor deposition (PVD), or other applicable methods. In some embodiments, the passivation layer 106 is made of USG with a thickness of about 12000 Å to about 15000 Å.

Figure 3B:
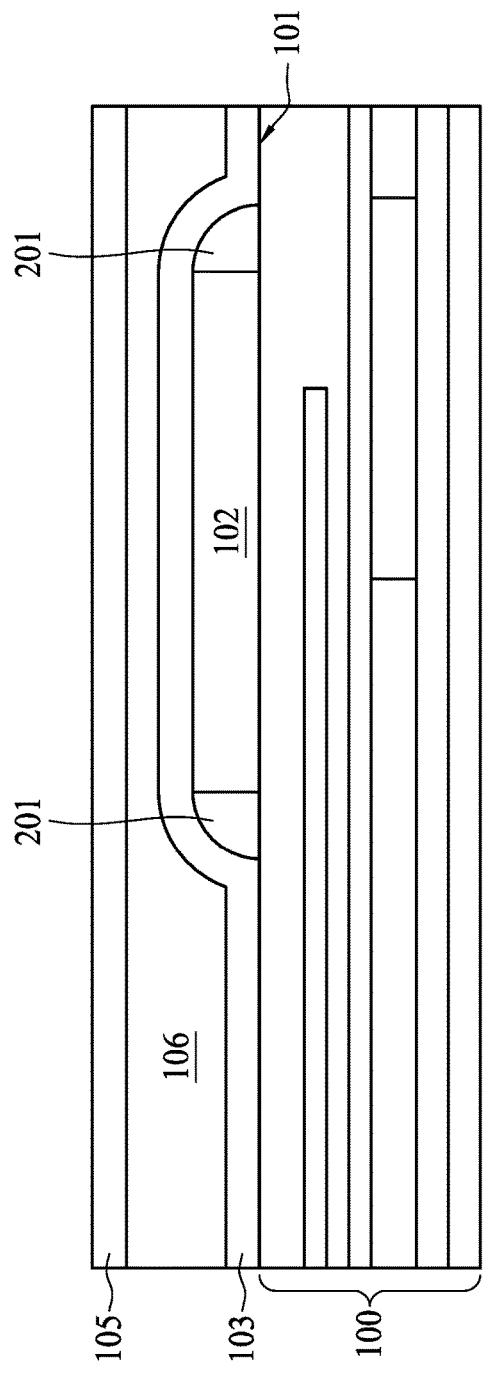
Figure 3C:
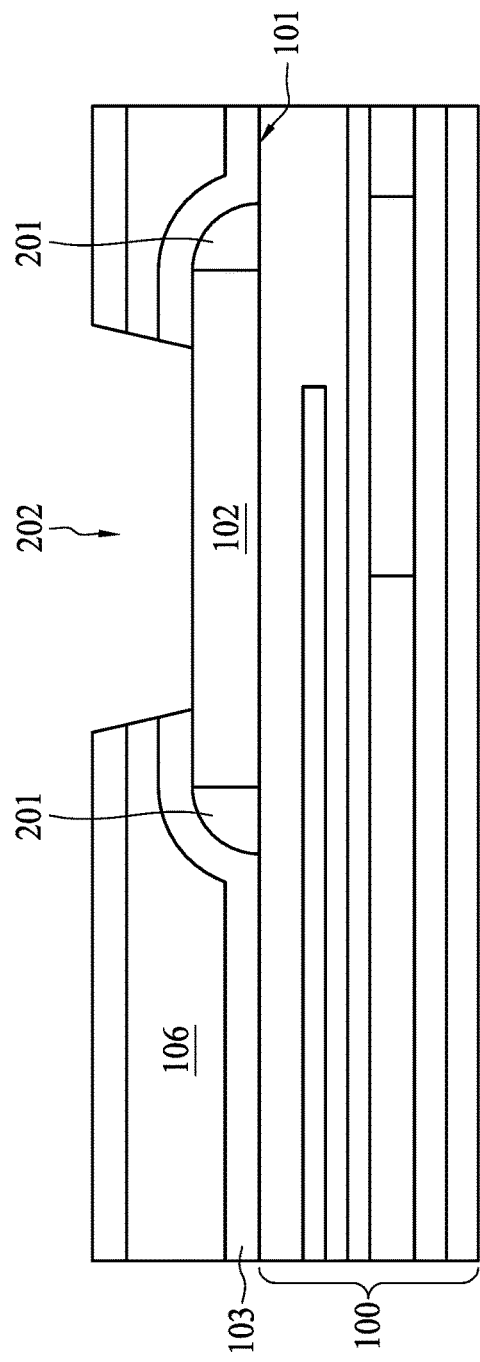
Figure 3D:
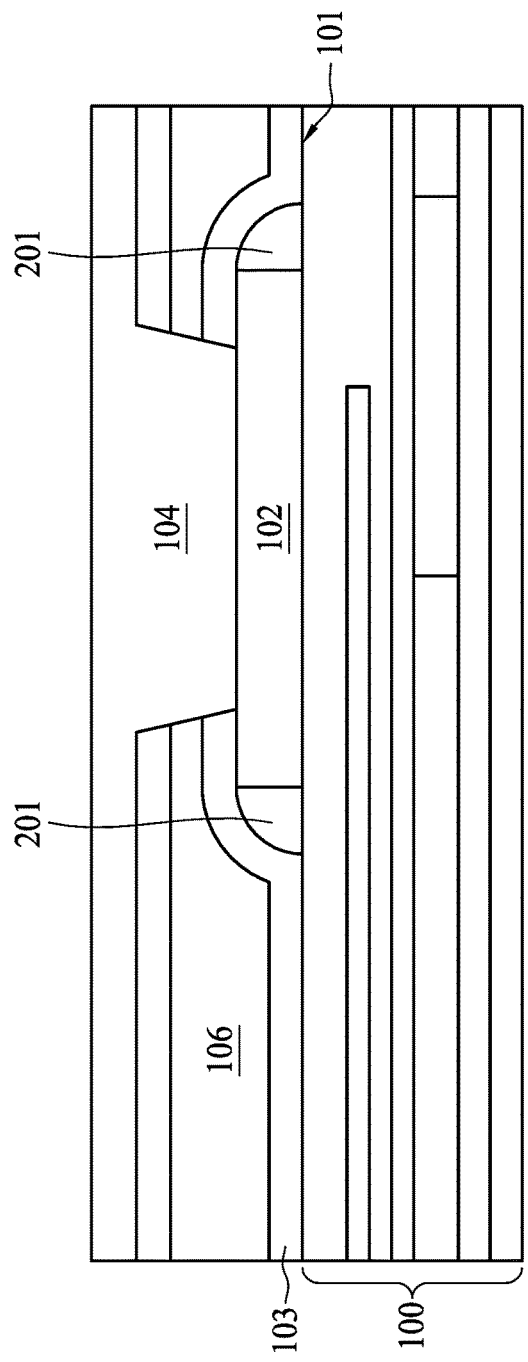

As shown in FIG. 3B, in some embodiments, a second protecting structure 105 is disposed on the passivation layer 106 after forming thereof, and therefore the passivation layer 106 is disposed between the first protecting structure 103 and the second protecting structure 105. The material of the second protecting structure 105 may be substantially identical to the first protecting structure 103. Generally, in some embodiments, the second protecting structure 105 may be composed of silicon nitride or silicon oxide with a thickness of about 7000 Å. In some embodiments, the second protecting structure 105 is formed by chemical vapor deposition (CVD), plasma-enhanced CVD, spin-on, or other applicable methods As shown in FIGS. 3C to 3F, and also refer to the previously addressed FIG. 1, in some embodiments, a polymer layer 104 is disposed over the first protecting structure 103 and the conductive pad 102, and a conductive bump 109 is formed and electrically coupled to the conductive pad 102 through an opening 202 of the polymer layer 104 after forming the second protecting structure 105. The polymer layer 104 is made by polyimide with a thickness about 50000 Å. The polymer layer 104 is patterned by a mask and implemented with an etching operation to have the opening 202 to expose a portion of the top surface of the conductive pad 102 for forming an under bump metallurgy (UBM) 108 thereon. After forming the UBM 108, the conductive bump 109 is formed on the UBM 108. In some embodiments, the conductive bump 109 includes a copper bumps 109a and a flat bump surface covered by a solder paste 109b. The solder paste 109b may be further reflowed and attached to the contact pads of other electrical components, for example, attached to a PCB.

Figure 3G:
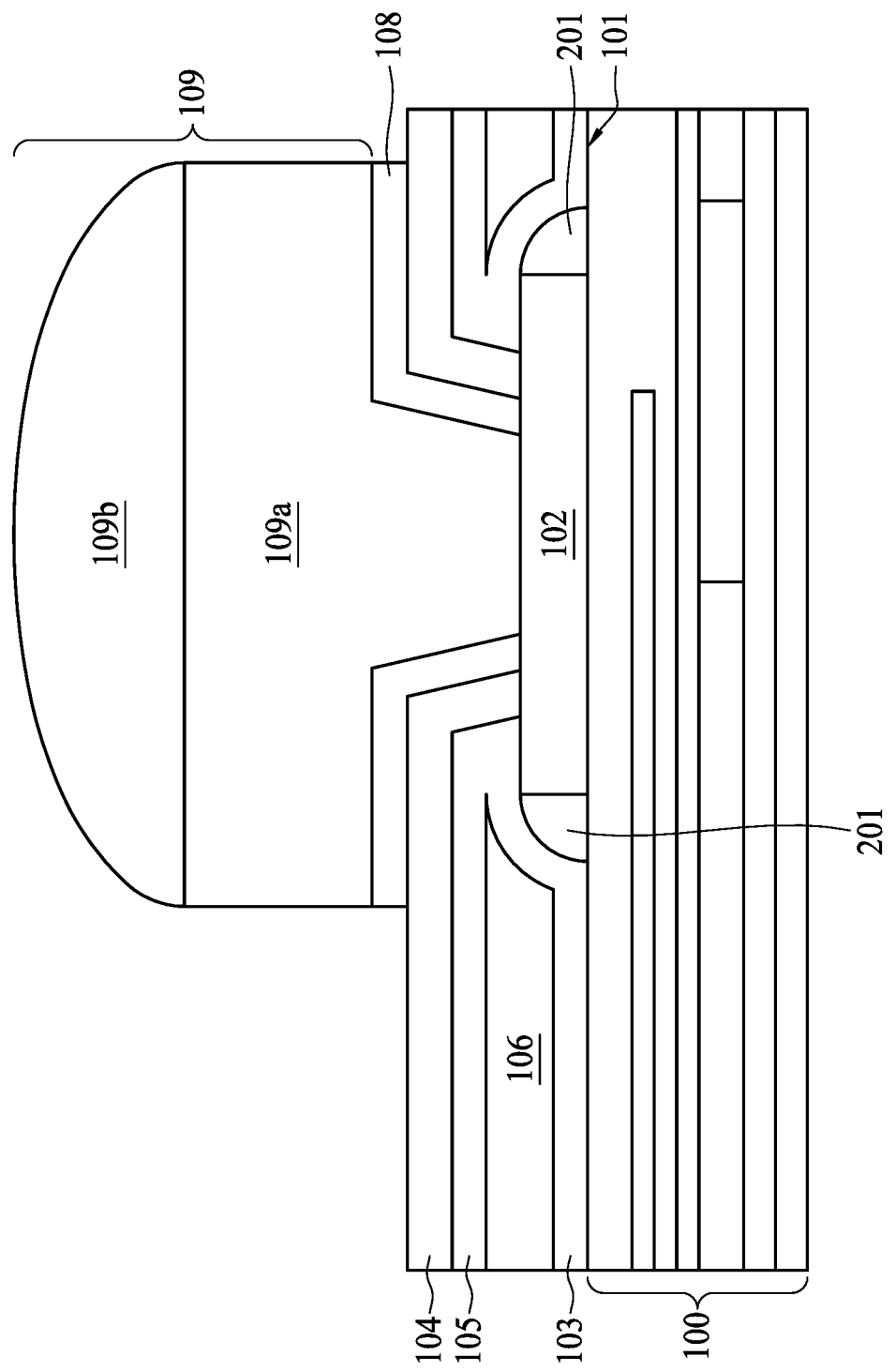
FIG. 3G illustrates a cross-sectional view of a semiconductor structure according to some embodiments of the present disclosure.

Although the first protecting structure 103 is leveled with the conductive pad 102 in some embodiment, as shown in FIG. 3G, further in some embodiments, the edges of the first protecting structure 103 is heightened by the spacers 201 and thus in contact with the second protecting structure 105. Accordingly, the first protecting structure 103 and the second protecting structure 105 may be integrated partially and resisting and dispersing the mechanical stress jointly.

Figure 4A:
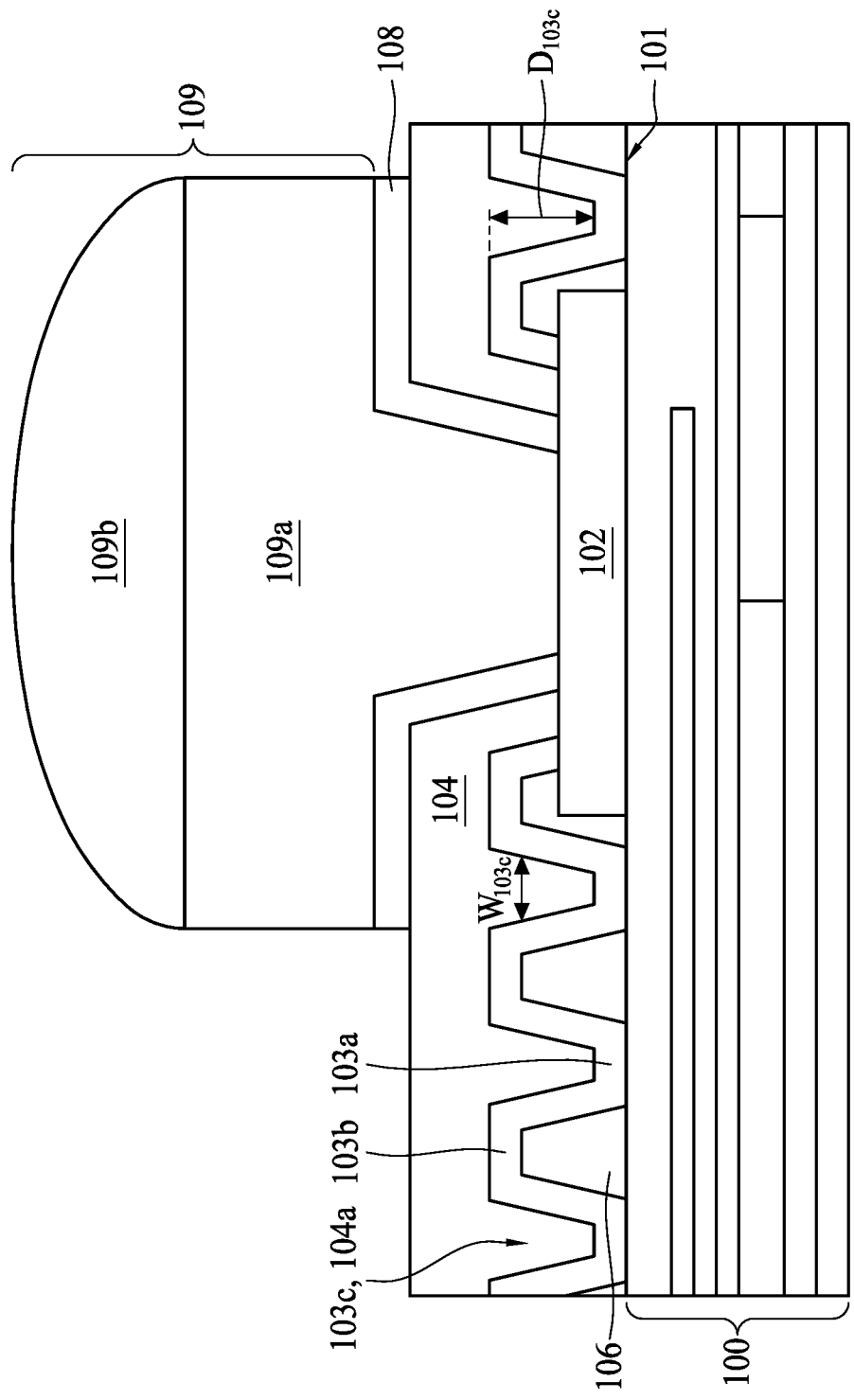
FIG. 4A illustrates a cross-sectional view of a semiconductor structure according to some embodiments of the present disclosure.

In the present disclosure, the first protecting structure may not be limited to a generally flat layer. As shown in FIG. 4A, in some embodiments, the first protecting structure 103 may be divided into a first portion 103a and a second portion 103b. The first portion 103a is leveled with the conductive pad 102, whereas the second portion 103b is higher than the conductive pad 102. In other words, the first protecting structure 103 may have a trench shaped structure and in contact with the dielectric surface 101 at the first portion 103a. In some embodiments, the first protecting structure 103 includes a plurality of trenches 103c and each of the trenches 103c are filled by the polymer layer 104. Accordingly, the polymer layer 104 thus includes a plurality of polymer protrusions 104a aligns to the same direction and forms a quasi-spring structure for absorbing mechanical stress. Moreover, because the polymer layer 104 is formed by polyimide which has a Young's modulus of 2.5 GPa and it is more flexible than the first portion 103a and a second portion 103b of the first protecting structure 103, as well as the passivation layer 106 therebelow. The portion of the polymer layer 104 extended into the trenches 103c may provide further absorbing functions to reduce the mechanical stress delivers to the structures below the dielectric surface 101.

Furthermore, in some embodiments, as shown in FIG. 4A, a width of the trench $W_{103c}$ is smaller than a depth of the trench $D_{103c}$, thus not only the density of the polymer protrusions 104a is high, but also the contacting area between the polymer layer 104 and the first protecting structure 103 is large. By increasing the contacting area, the mechanical stress originates from chip packaging interaction will be harder to be delivered to the structures below the first protecting structure.

Figure 4B:
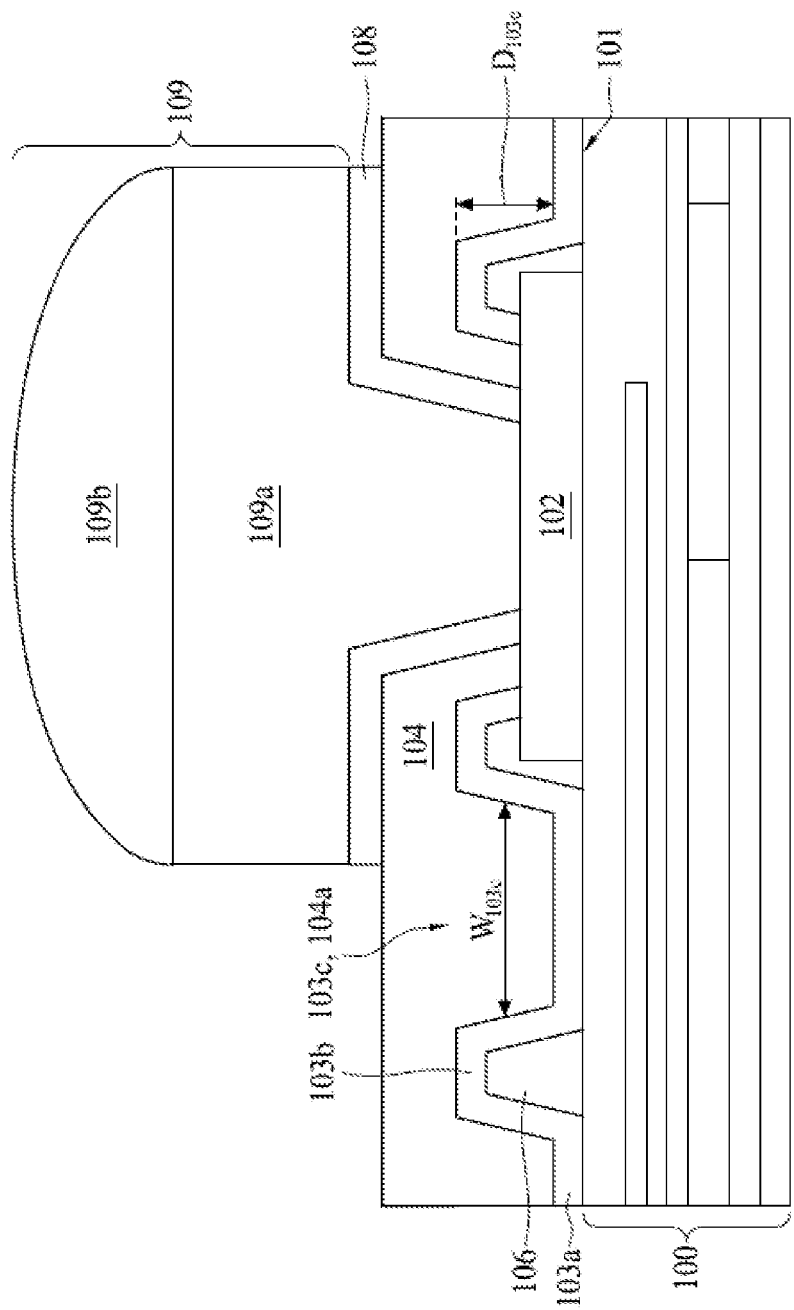
FIG. 4B illustrates a cross-sectional view of a semiconductor structure according to some embodiments of the present disclosure.

In some embodiments, as shown in FIG. 4B, the width of the trench $W_{103c}$ is larger than a depth of the trench $D_{103c}$ the density of the polymer protrusions 104a is less than previous embodiments but each polymer protrusion 104a has more amount of polymer material and therefore the polymer layer 104 may absorb more mechanical stress delivers form the conductive bump 109 and protect the structures therebelow.

Figure 4C:
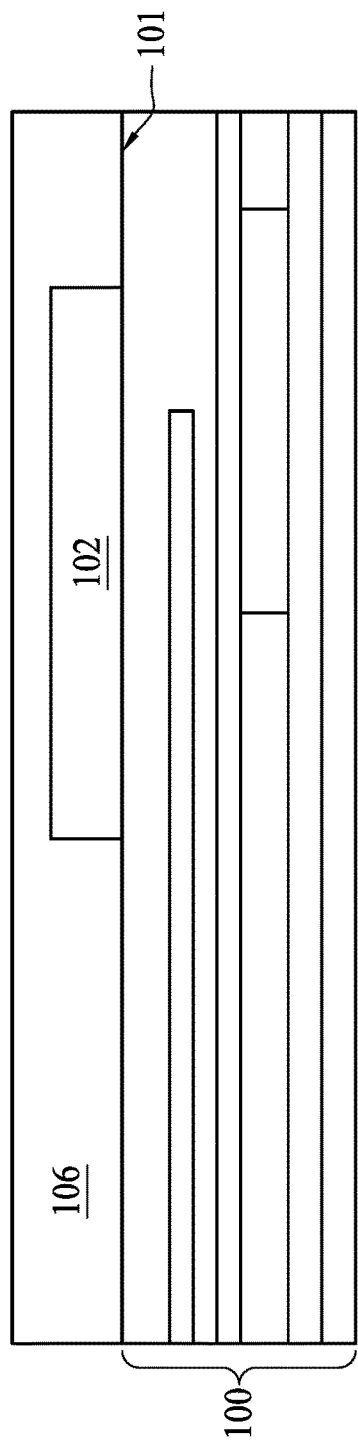
Figure 4D:
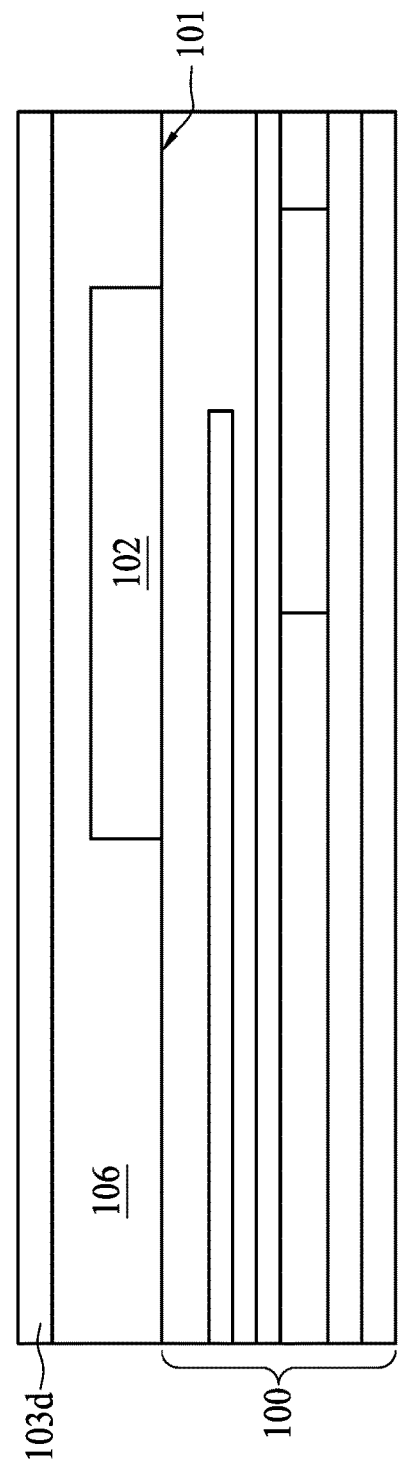
Figure 4E:
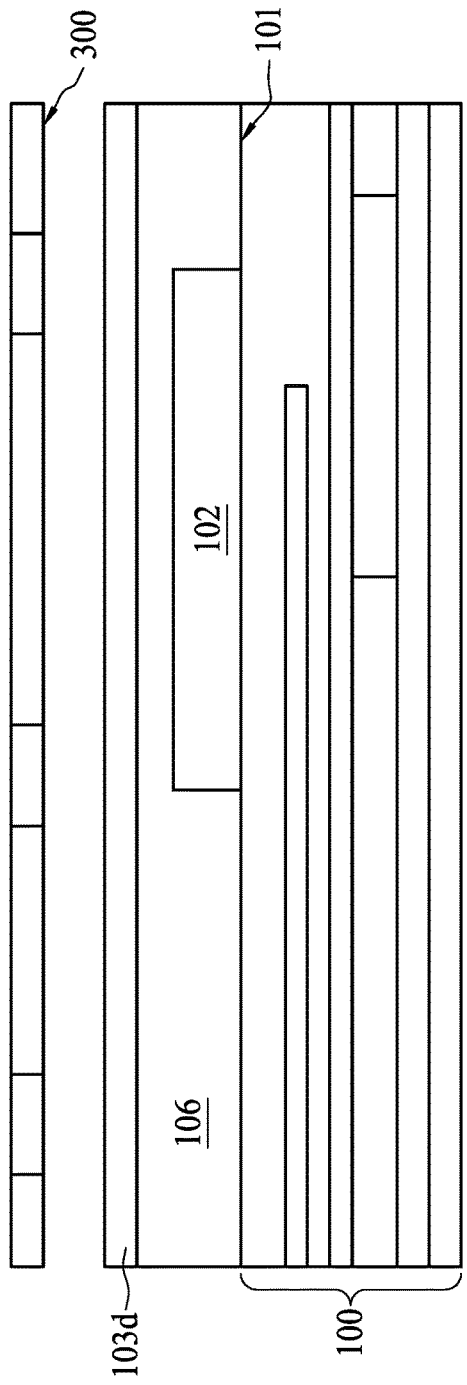
Figure 4F:
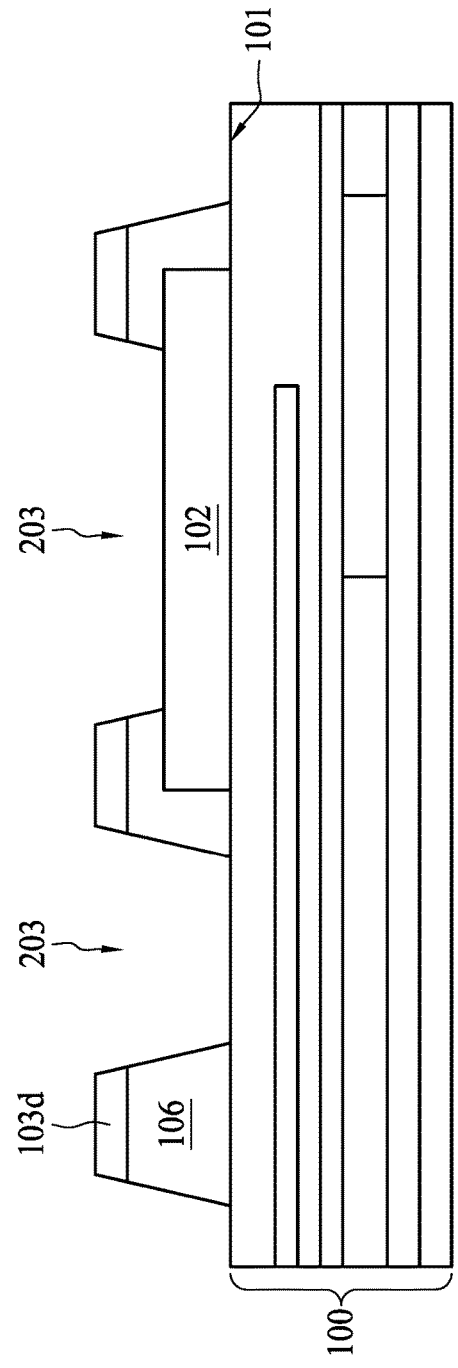
Figure 4G:
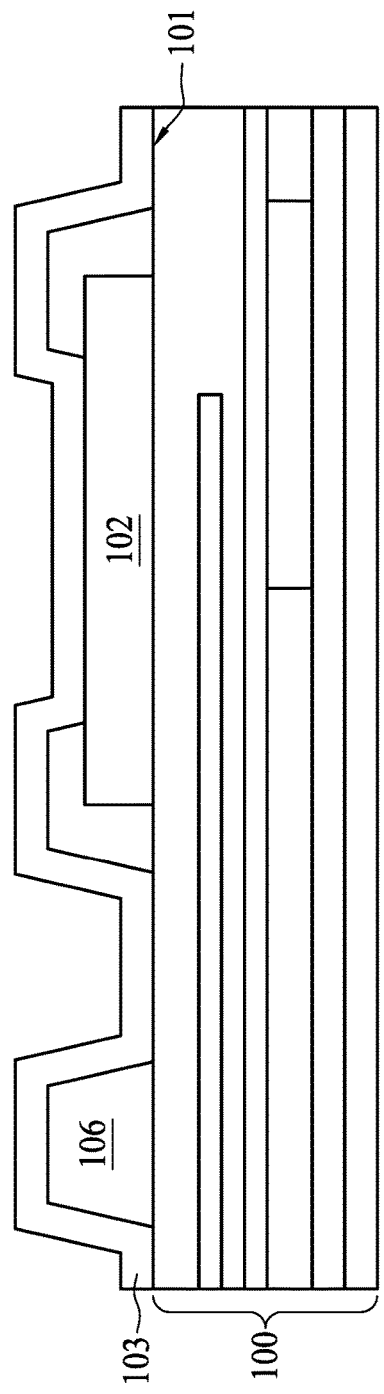

The forming of the first protecting structure 103 includes various operations. As shown in FIGS. 4C and 4D, the passivation layer 106 is disposed on the dielectric surface 101 and the conductive pad 102. In some embodiments, the passivation layer 106 is made of undoped silicate glass (USG) under high density plasma (HDP) and with a thickness of from about 12000 Å to 15000 Å. Alternatively, other methods such as chemical vapor deposition (CVD), plasma-enhanced CVD, or spin-on are also applicable. And then, a preliminary protecting structure 103d is disposed on the passivation layer 106. In some embodiments, the preliminary protecting structure 103d is formed by silicon nitride or silicon oxide with a thickness of about 7000 Å. As shown in FIGS. 4E and 4F, the preliminary protecting structure 103d and the passivation layer 106 are patterned by a mask 300 and implemented with an etching operation to have a plurality of openings 203 to expose a portion of the top surface of the conductive pad 102 and a portion of the dielectric surface 101. Generally, the bottoms of the openings 203 are not lower than the dielectric surface 101 to avoid damaging the metallization structure 100. As shown in FIG. 4G, by another deposition operation, the material of the protecting structure such as silicon nitride or silicon oxide are further disposed on the sidewalls and bottoms of the openings 203, by integrating with the preliminary protecting structure 103d, the first protecting structure 103 is therefore formed on the dielectric surface 101 and cover the passivation layer 106 and the conductive pad 102. In some embodiments, the thickness of the integrated first protecting structure 103 is no less than about 7000 Å.

Figure 4H:
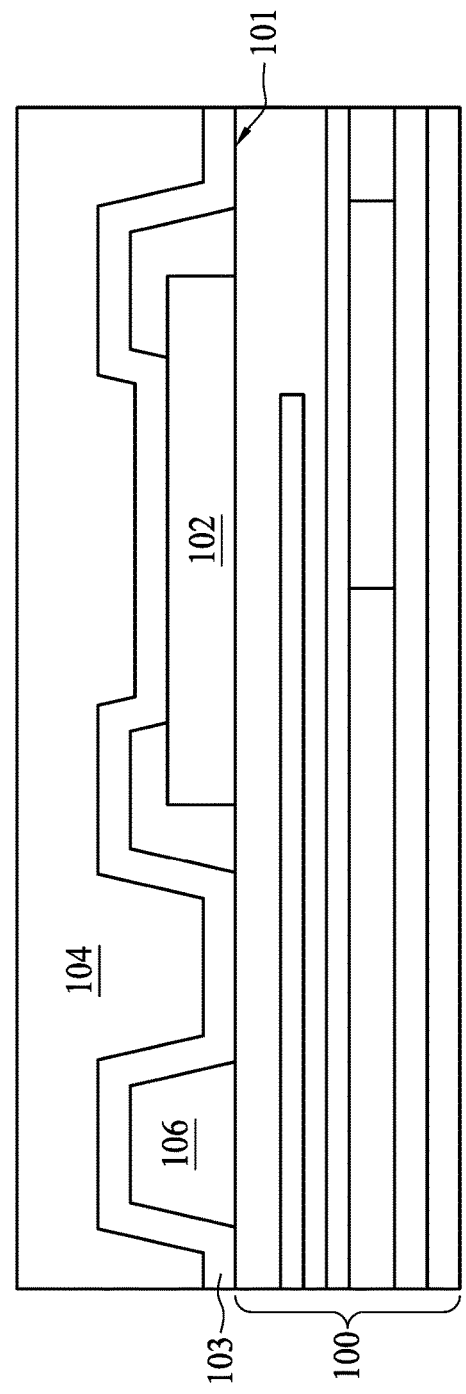

As shown in FIGS. 4H to 4J, in some embodiments, the polymer layer 104 is disposed on the first protecting structure 103 and over the passivation layer 106 and the conductive pad 102. The polymer layer 104 is made by polyimide with a thickness about 50000 Å. The polymer layer 104 is patterned by a mask 301 and implemented with an etching operation to have the opening 204 to expose a portion of the top surface of the conductive pad 102 for forming the under bump metallurgy (UBM) thereon. Accordingly, in some embodiments, the second protecting structure as previously shown in FIG. 3G may not be disposed independently from the first protecting structure, instead, the second protecting structure may be integrated with the first protecting structure in certain circumstances. For instance, in the case of the protecting structure including a periodic change of pattern below the polymer layer.

In some embodiments, the first protecting structure 103 in FIG. 4G may be formed directly by fewer operations instead of forming the preliminary protecting structure 103d in advance as shown in FIGS. 4D to 4F. For illustration, as shown in FIGS. 5A and 5B, after forming the passivation layer 106 on the dielectric surface 101 and the conductive pad 102, the passivation layer 106 is patterned by a mask 302 and implemented with an etching operation to have a plurality of openings/trenches 205 to expose a portion of the top surface of the conductive pad 102 and a portion of the dielectric surface 101. Next, the first protecting structure 103 is disposed on the passivation layer 106 and the exposed conductive pad 102, and therefore covers the sidewalls of the openings/trenches 205. In some embodiments, the first protecting structure 103 may be formed in a single deposition operation, whereas in some other embodiments, it may be formed in separated deposition operations. The different approaches with different operations may be selected depends on the convenience of process, for instance, to comply with standard logic process.

Figure 6:
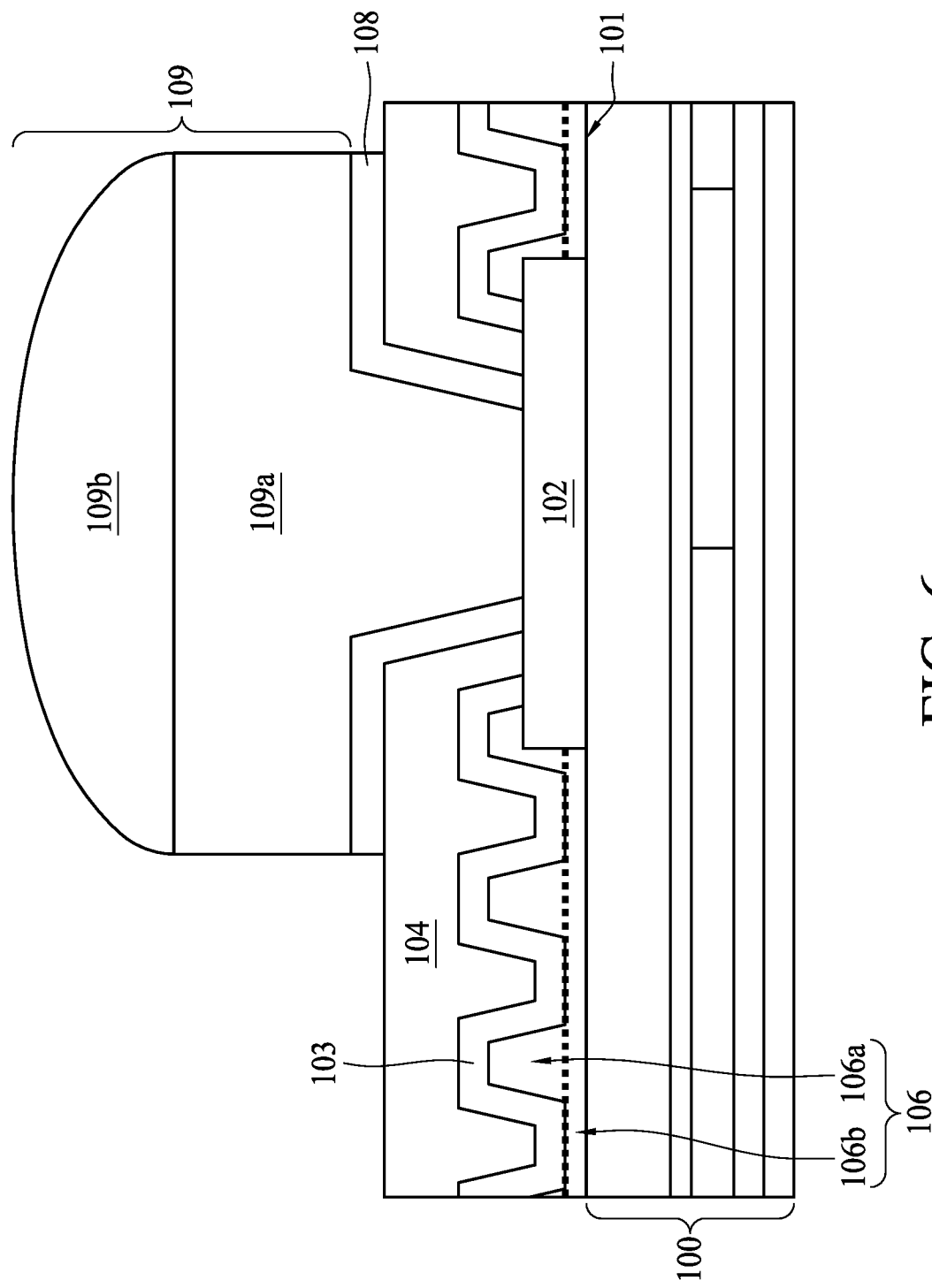
FIG. 6 illustrates a cross-sectional view of a semiconductor structure according to some embodiments of the present disclosure.

In some embodiments, as shown in FIG. 6, the first protecting structure 103 is disposed on the passivation layer 106 with a trench shaped structure having a plurality of turns that changes periodically along the upper surface of the passivation layer 106. The bottom surface of the first protecting structure 103 may be raised from the dielectric surface 101. In other words, in some embodiments, the position of the first protecting structure 103 depends on the structure of the passivation layer 106. In some embodiments, the passivation layer 106 includes a plurality of protrusions 106a higher than the conductive pad 102. Accordingly, when the protrusions 106a are on the dielectric surface 101 with a common base 106b in some embodiments, the first protecting structure 103 is thus raised from the dielectric surface 101; and when the protrusions 106a are on the dielectric surface 101 without the common base 106b, the first protecting structure 103 may in contact with the dielectric surface 101. Furthermore, in some embodiments, the height of the common base 106b is less than the height of the conductive pad 102, and the bottom of the first portion 103a of the first protecting structure 103 is lower than the top surface of the conductive pad 102.

In some embodiment, the height of the protrusions 106a may be identical to the height of the conductive pad 102. In some embodiments, the protrusions 106a cover the sidewalls of the conductive pad 102. Refer to the previously addressed FIG. 1, in some embodiments, the protrusions can be the spacers 201.

Figure 7:
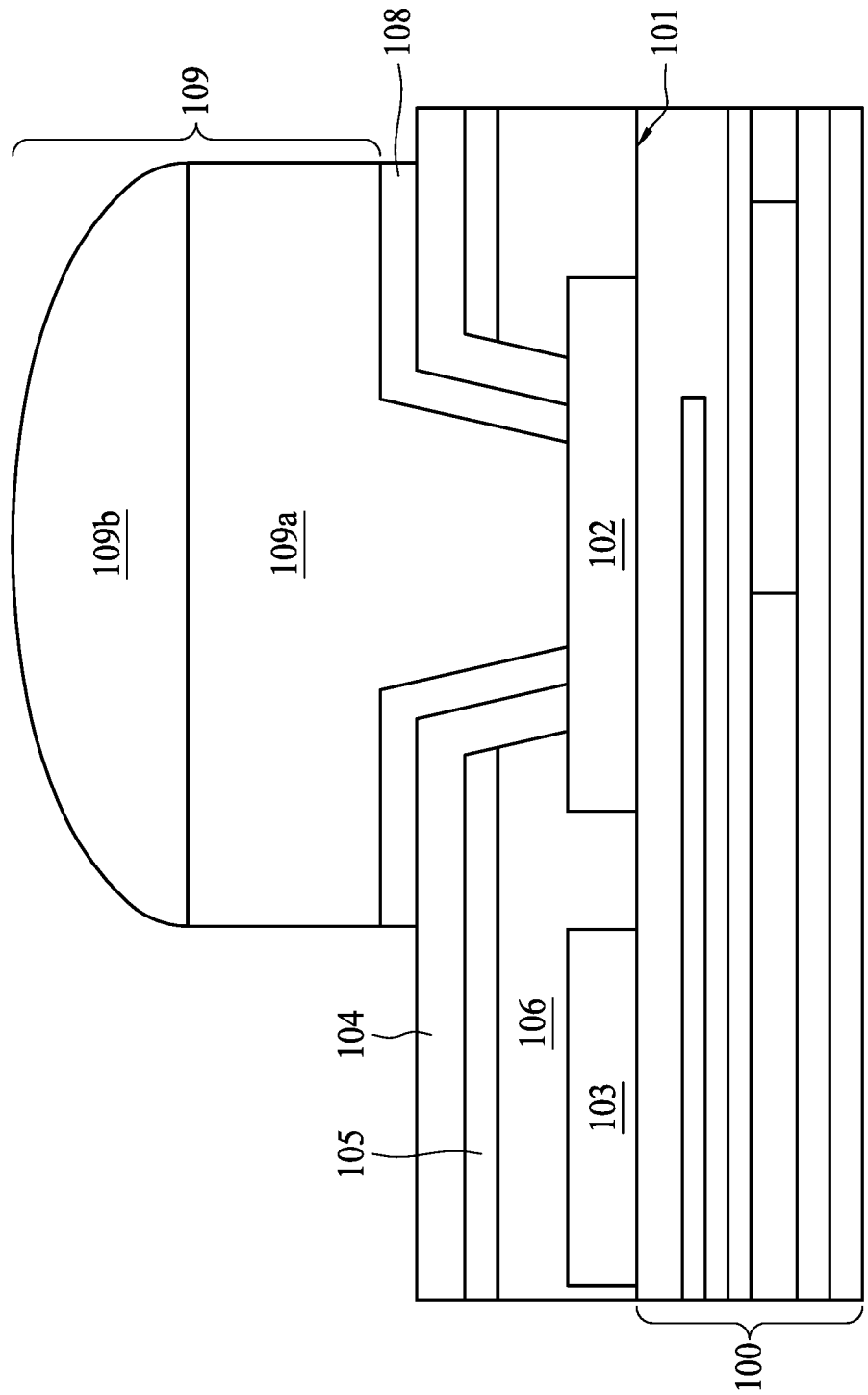
FIG. 7 illustrates a cross-sectional view of a semiconductor structure according to some embodiments of the present disclosure.

Comparing to the embodiments as shown in previously addressed FIG. 3G, in some embodiments, the first protecting structure 103 is not only disposed on the dielectric surface 101 of the metallization structure 100 and leveled with the conductive pad 102, but also laterally surrounded by the passivation layer 106. In other words, in some embodiments as shown in FIG. 7, the first protecting structure 103 covers a portion of the dielectric surface 101 and the exposed dielectric surface 101 may further be covered by the passivation layer 106. In FIG. 7, the first protecting structure 103 can be a dummy conductive pad leveled with the conductive pad 102 receiving the conductive bump 109a. The dummy conductive pad may not be electrically coupled to any component in the chip.

Figure 8A:
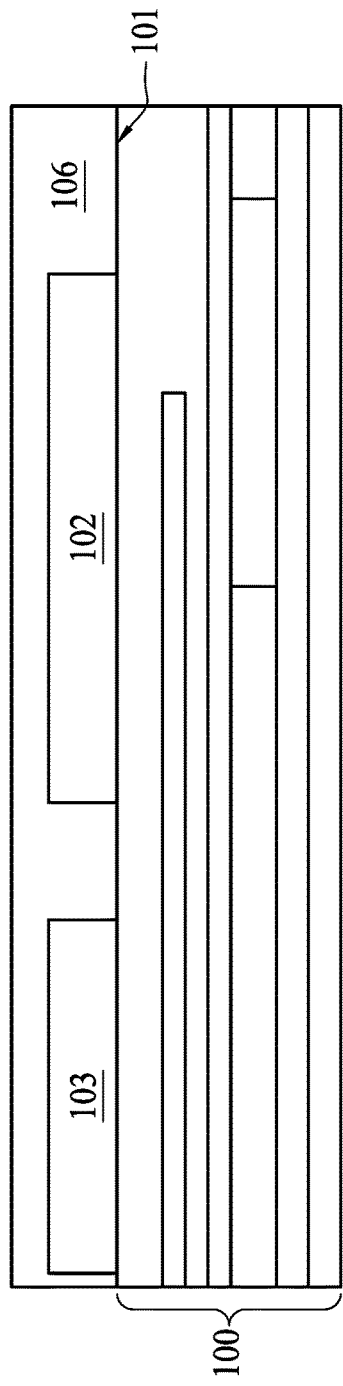

As shown in FIG. 8A, in some embodiments, the first protecting structure 103 is disposed on the dielectric surface 101, the material of the first protecting structure 103 may be identical to the conductive pad 102. In some embodiments, the first protecting structure 103 may be formed by silicon nitride or silicon oxide whereas the conductive pad 102 is formed by any suitable conductive material includes but not limited to metal (e.g., copper, tantalum, titanium, molybdenum, tungsten, platinum, aluminum, hafnium, ruthenium), metal silicide (e.g., titanium silicide, cobalt silicide, nickel silicide, tantalum silicide), or metal nitride (e.g., titanium nitride, tantalum nitride). Hence, the conductive pad 102 and the first protecting structure 103 are formed in different operations due to different materials. However, in some embodiments, the material of the first protecting structure 103 and the material of the conductive pad 102 are substantially identical. Namely, the first protecting structure 103 is also formed by any suitable conductive material includes but not limited to metal, metal silicide, or metal nitride. In some embodiments, both of the conductive pad 102 and the first protecting structure 103 are formed simultaneously by chemical vapor deposition (CVD), low pressure chemical vapor deposition, physical vapor deposition (PVD), atomic layer deposition, or spin-on. In some embodiment, the first protecting structure 103 is a dummy pad.

In some embodiment, the top surface of the first protecting structure 103 is aligned with the top surface of the conductive pad 102. In some embodiments, the thickness of the first protecting structure 103 is about 25000 Å to 30000 Å.

Figure 8B:
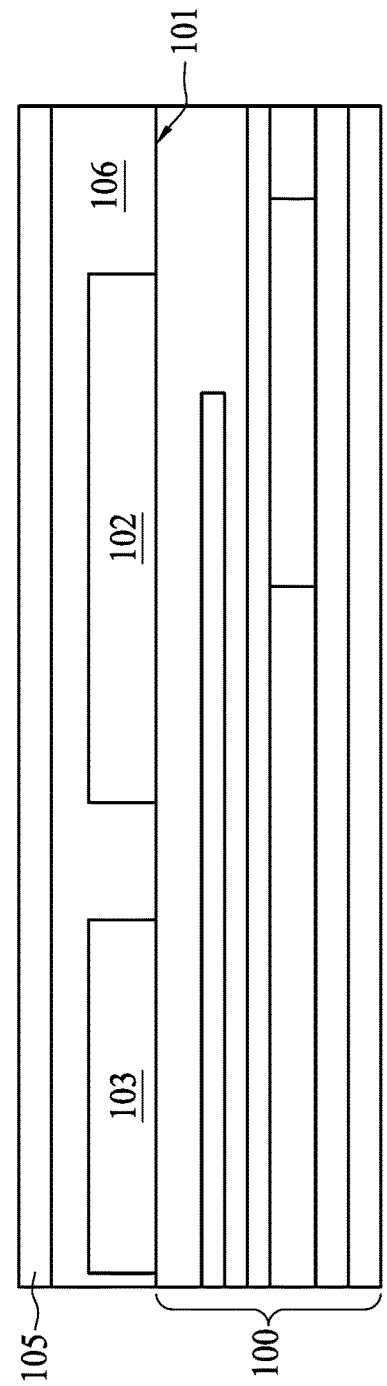

As shown in FIG. 8B, in some embodiment, after forming the conductive pad 102 and the first protecting structure 103 on the dielectric surface 101, the passivation layer 106 is disposed by plasma enhanced oxide deposition (PEOX) and covers the exposed dielectric surface 101, the conductive pad 102 and the first protecting structure 103. In some embodiments, the thickness of the passivation layer 106 is about 12000 Å. Then, the preliminary protecting structure 105a is disposed on the passivation layer 106. In some embodiments, the thickness of the preliminary protecting structure 105a is about 7000 Å.

Figure 8C:
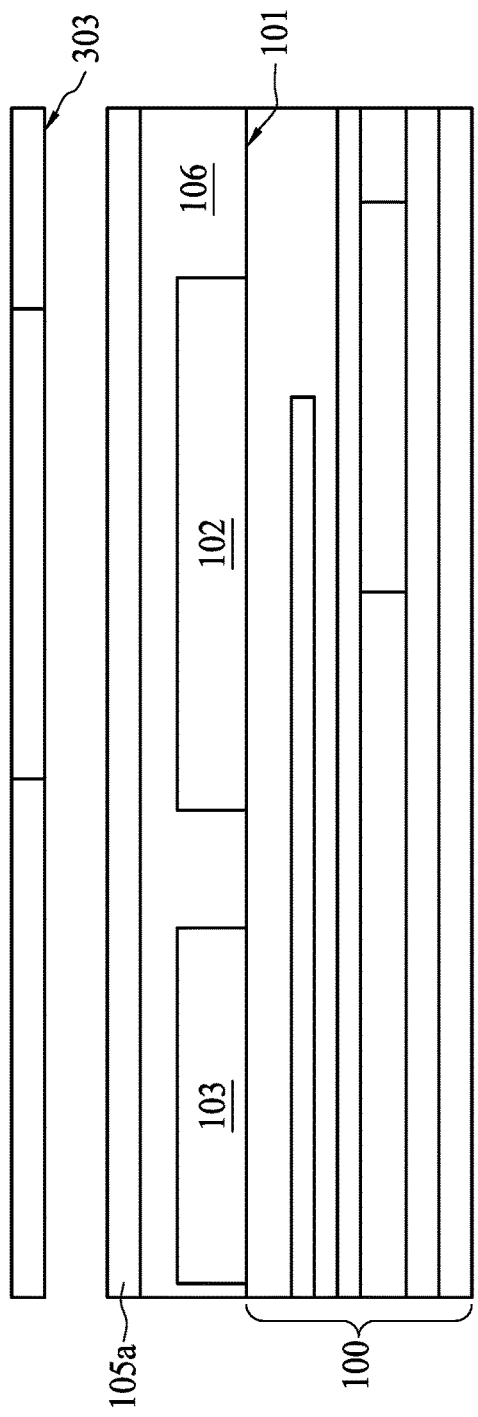
Figure 8D:
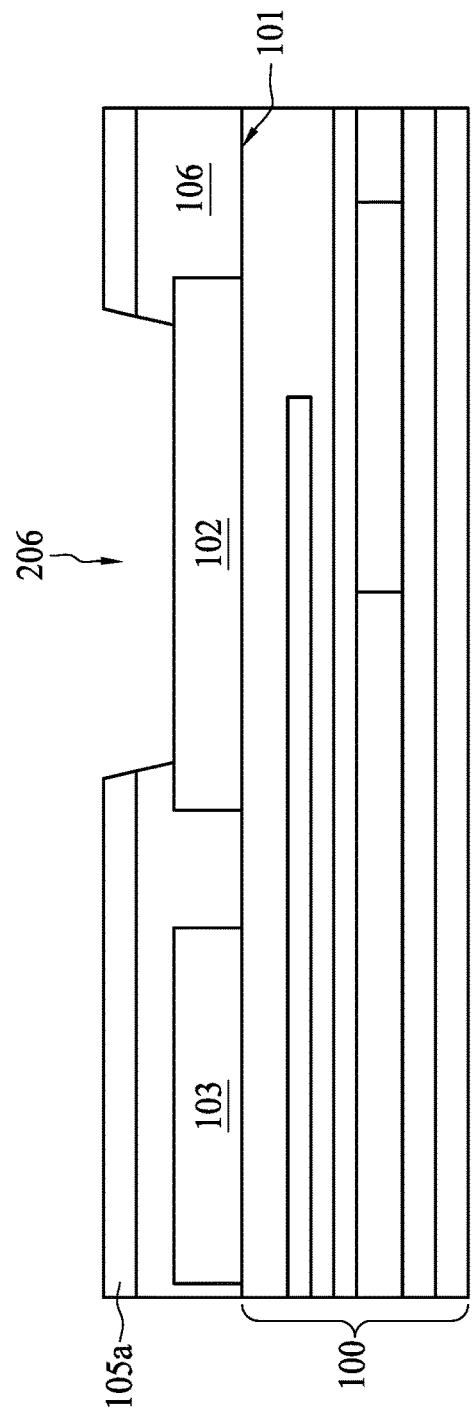

As shown in FIGS. 8C and 8D, the passivation layer 106 and the preliminary protecting structure 105a are patterned by a mask 303 and implemented with an etching operation to have an opening 206 to expose a portion of the top surface of the conductive pad 102. Afterwards, in some embodiments, as shown in FIG. 8E, the material of the protecting structure such as silicon nitride or silicon oxide are further disposed on the preliminary protecting structure 105a and the sidewall and bottom of the openings 206, by integrating with the preliminary protecting structure 105a, the second protecting structure 105 is therefore formed on the passivation layer 106 and the conductive pad 102. In some embodiments, the thickness of the material of the protecting structure disposed posterior to the forming of the second protecting structure 105 is about 2000 Å to 5000 Å.

In addition, in some embodiments, as shown in FIG. 8F, a third protecting structure 110 may be disposed on the second protecting structure 105. The material of the third protecting structure 110 may be any suitable conductive material includes but not limited to metal, metal silicide, or metal nitride. In some embodiments, the material of the third protecting structure 110 and the material of the conductive pad 102 are substantially identical. In some embodiments, the material of the first protecting structure 103, the third protecting structure 110, and the conductive pad 102 are substantially identical. In some embodiments, the thickness of the third protecting structure 110 is about 2000 Å to 5000 Å. By using the third protecting structure 110, the mechanical stress from chip packaging interaction may be released horizontally to the areas distant to the conductive bump 109, so that there is less mechanical stress be delivered vertically or obliquely to the metallization structure and damage the layers thereof.

Figure 9A:
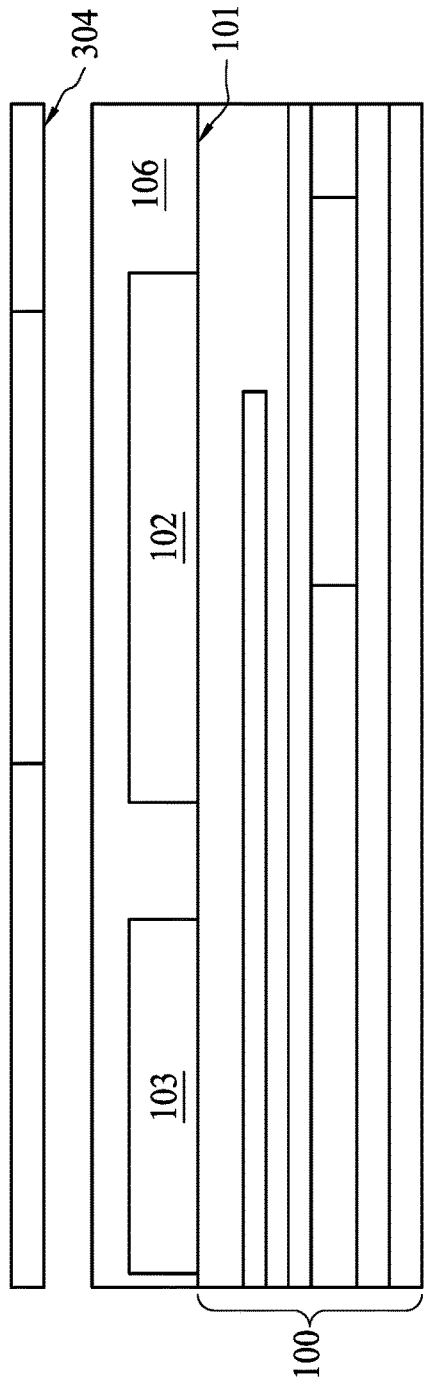
FIGS. 9A and 9B illustrate cross-sectional views at various operations of manufacturing a semiconductor structure according to some embodiments of the present disclosure.
Figure 9B:
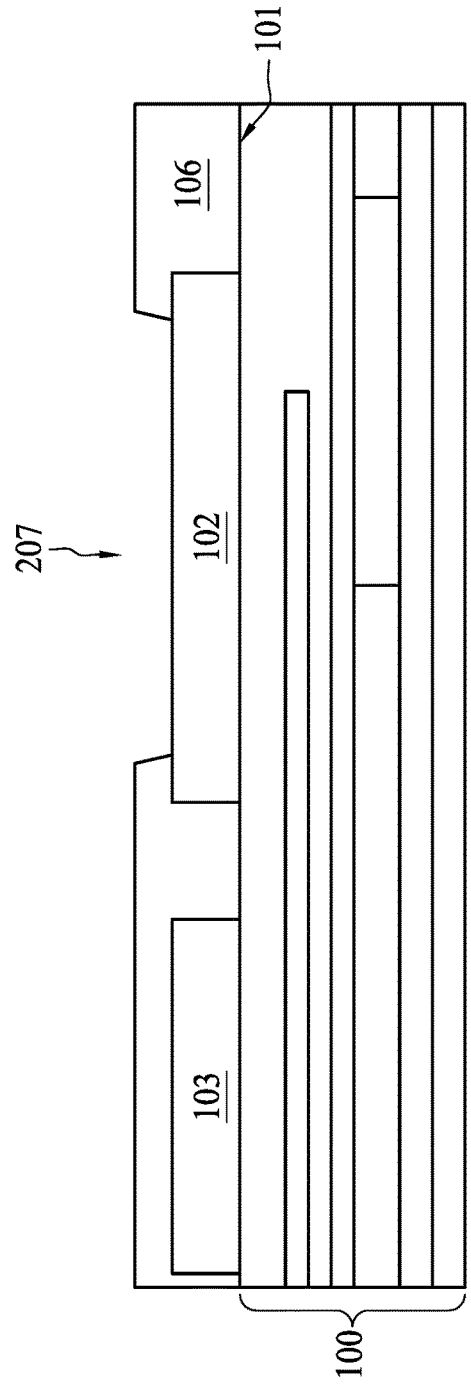

In some embodiments, the second protecting structure 105 in FIG. 8E may be formed directly by less operations instead of forming the preliminary protecting structure 105a in advance as shown in FIGS. 8B to 8D. As shown in FIGS. 9A and 9B, after forming the passivation layer 106 on the first protecting structure 103, the dielectric surface 101, and the conductive pad 102, the passivation layer 106 is patterned by a mask 304 and implemented with an etching operation to have an openings 207 to expose a portion of the top surface of the conductive pad 102. Next, the second protecting structure (not shown) may be disposed on the passivation layer 106 and the exposed conductive pad 102, and also covers the sidewalls of the openings 207. Accordingly, in some embodiments, the second protecting structure may be formed in a single deposition operation, whereas in some other embodiments, it may be formed in separated deposition operations. The different approaches with different operations may be selected depends on the convenience of process, for instance, to comply with standard logic process.

Figure 10:
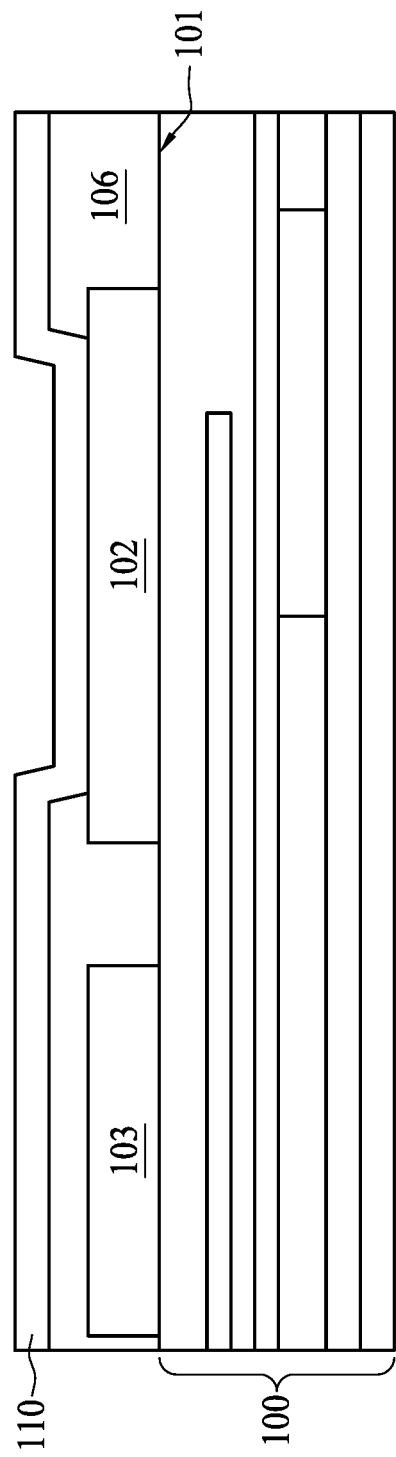
FIG. 10 illustrates a cross-sectional view of a third protecting structure according to some embodiments of the present disclosure.

As shown in FIG. 10 and the previously presented FIG. 8E, in some embodiments, the second protecting structure 105 may not be disposed after forming the passivation layer 106, instead, only the third protecting structure 110 is disposed on the passivation layer 106. In such embodiment, the third protecting structure 110 is made by metal, metal silicide, or metal nitride instead of silicon nitride or silicon oxide. It is considered that the ductility of metal material may provide better performance in resisting and dispersing the mechanical stress than silicon nitride and silicon oxide.

Figure 11A:
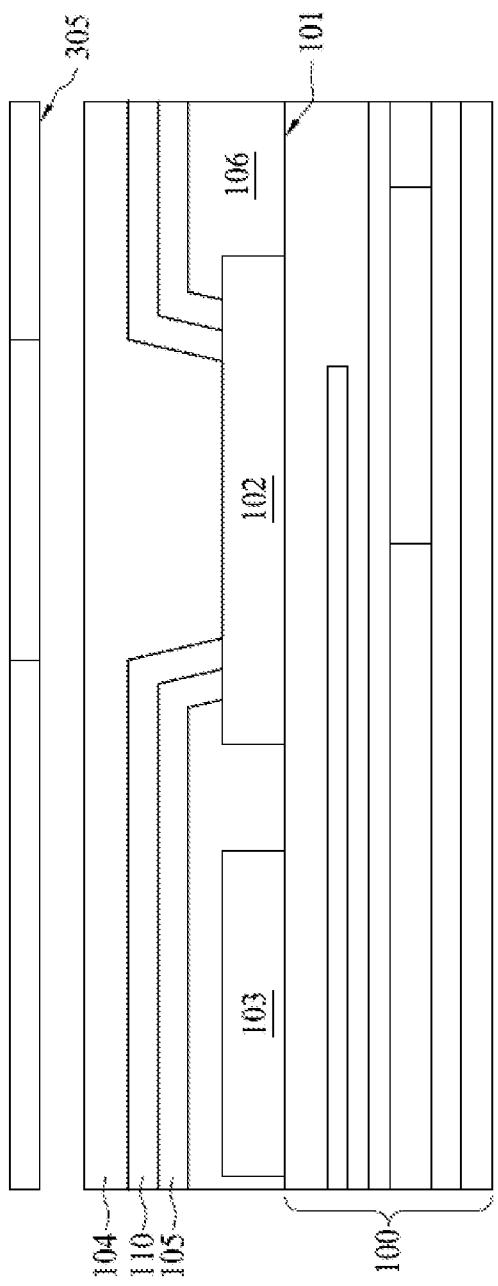
FIGS. 11A and 11B illustrate cross-sectional views at various operations of manufacturing a semiconductor structure according to some embodiments of the present disclosure.
Figure 11B:
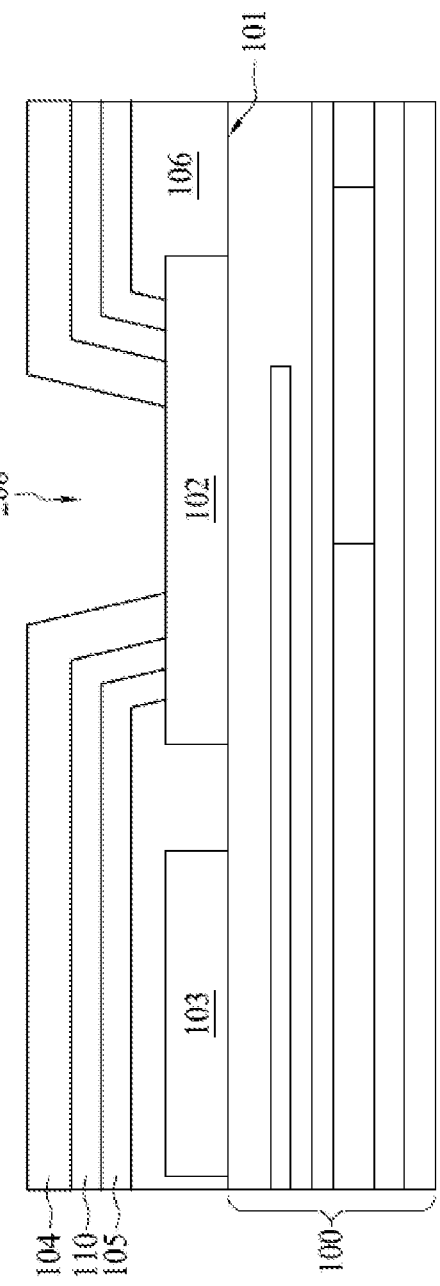
Figure 12:
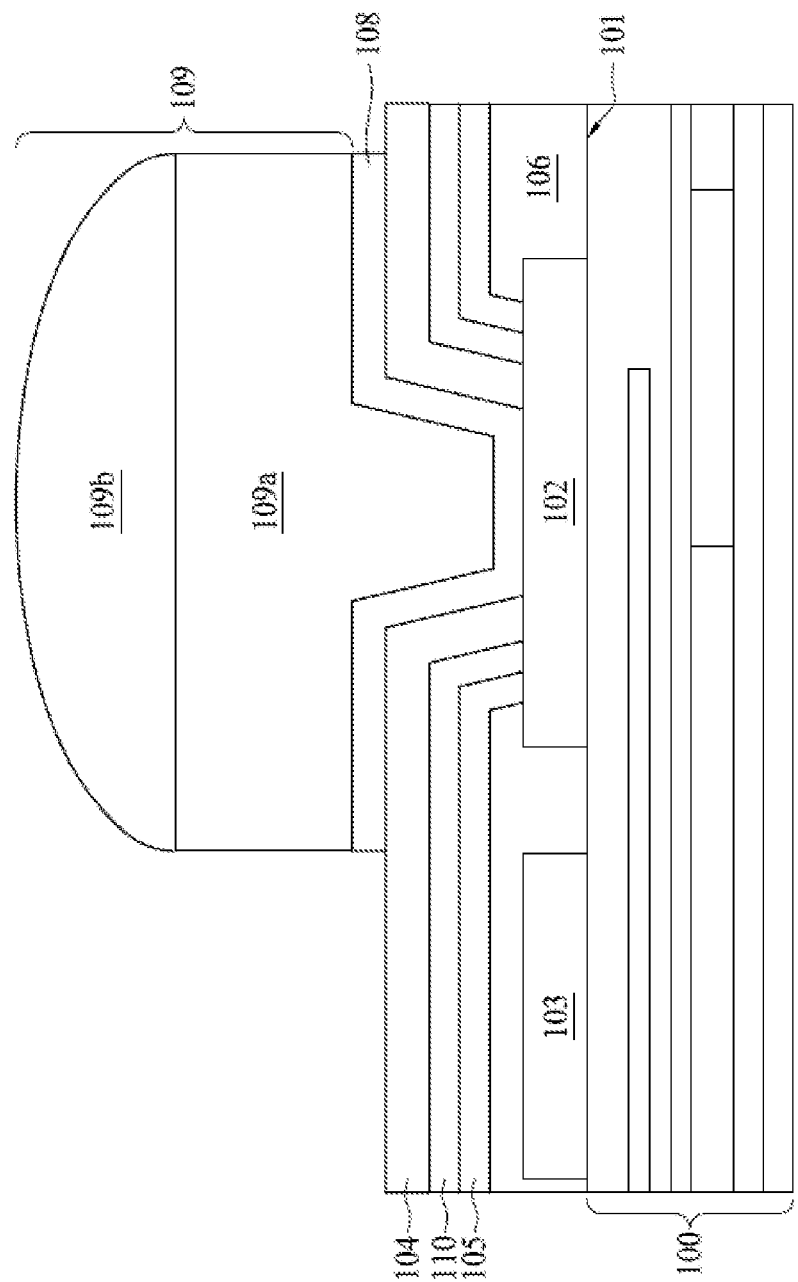
FIG. 12 illustrates a cross-sectional view of a semiconductor structure according to some embodiments of the present disclosure.

As shown in FIGS. 11A, 11B, and 12, in some embodiments, after the forming the third protecting structure 110, the polymer layer 104 is disposed thereon. In some embodiments, the polymer layer 104 is made by polyimide with a thickness about 50000 Å. Then, the polymer layer 104 is patterned by a mask 305 and implemented with an etching operation to have the opening 208 to expose a portion of the top surface of the conductive pad 102 for forming an under bump metallurgy (UBM) 108 thereon. After forming the UBM 108, the conductive bump 109 is formed on the UBM 108. In some embodiments, the conductive bump 109 includes the copper bump 109a and the flat bump surface covered by the solder paste 109b. The solder paste 109b may be further reflowed and attached to the contact pads of other electrical components.

Figure 13:
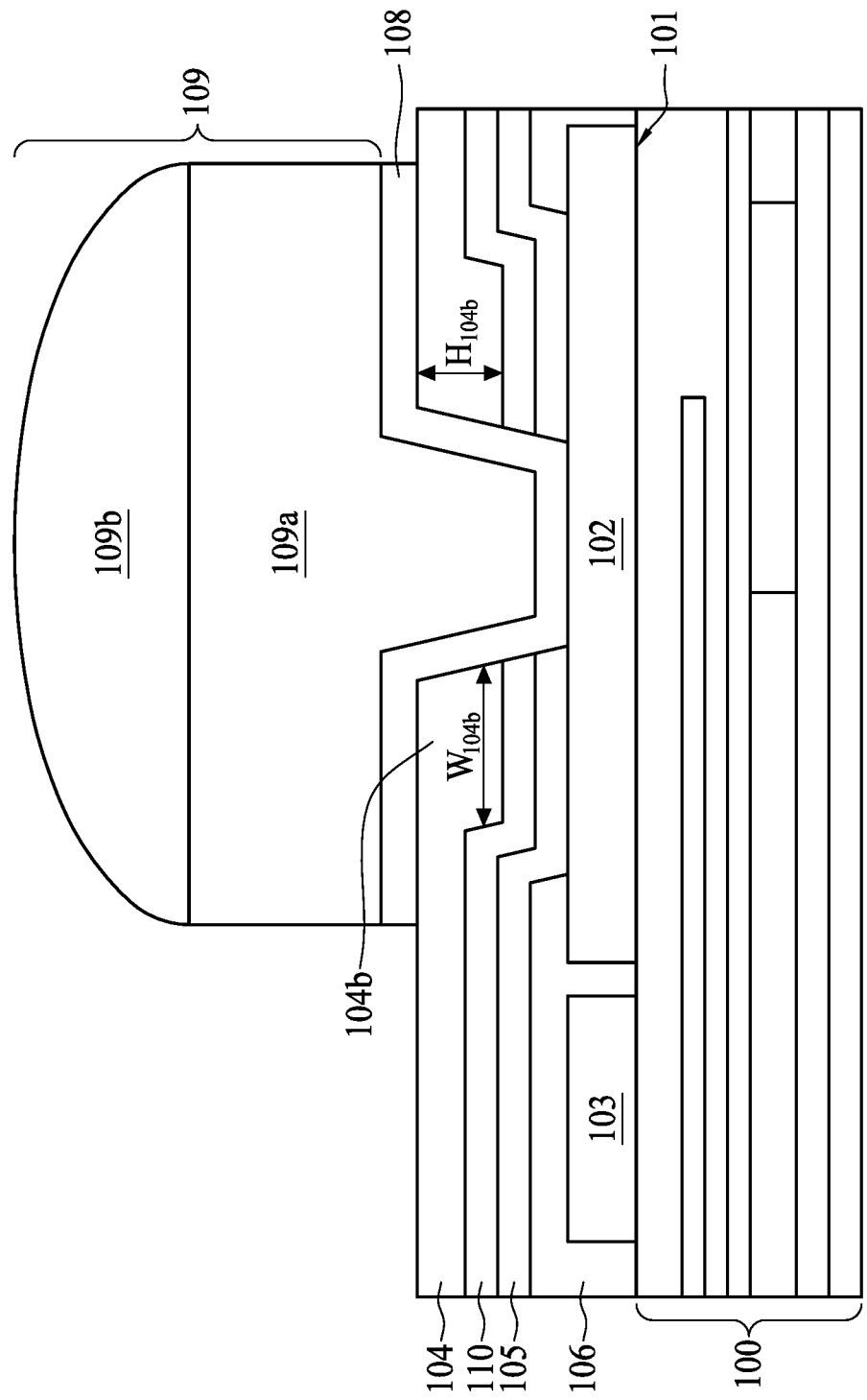
FIG. 13 illustrates a cross-sectional view of a semiconductor structure according to some embodiments of the present disclosure.

As shown in FIG. 13, in some embodiments, the conductive pad 102 is elongated to protect the layers therebelow. In some embodiments, the width of the conductive pad 102 is larger than the width of the copper bump 109a measured above the surface of the polymer layer 104. Furthermore, in some embodiments, not only the conductive pad 102 is elongated, but also the amount of the polymer below the conductive bump 109 is increased. By having an elongated conductive pad, in some embodiments, the polymer layer 104 includes at least a thickening portion 104b between the second protecting structure 105 and the under bump metallurgy (UBM) 108 over the conductive pad 102, and a horizontal width $W_{104b}$ of the thickening portion 104b is larger than a vertical height $H_{104b}$ thereof. In some embodiments, the horizontal width $W_{104b}$ of the thickening portion 104b is larger than 50000 Å. The thickening portions 104b may perform as buffer structures to absorb the mechanical stress form the conductive bump 109. Especially the positions of the thickening portions 104b are close to the position where the mechanical stress occurs and the cracks originates, which are critical in solving the cracking issue raised by chip packaging interaction.

In the present disclosure, the semiconductor structure includes at least a protecting structure disposed on the dielectric surface of the metallization structure and leveled with the conductive pad. And the protecting structure may cover the dielectric surface entirely or partially among different embodiments. Also, the protecting structure may be a generally flat layer or a trench shaped structure among different embodiments and cooperate with the shape of the polymer layer thereabove. Furthermore, the protecting structure may be separated into divided layers and disposed between the under bump metallurgy and the metallization structure.

In one exemplary aspect, a semiconductor structure is provided. The semiconductor structure includes: a metallization structure, a first protecting structure, a conductive pad, a polymer layer, and a conductive bump. The metallization structure has a dielectric surface. The first protecting structure is on the dielectric surface. The conductive pad is on the dielectric surface and is leveled with the first protecting structure. The polymer layer is over the first protecting structure and the conductive pad. The conductive bump is electrically coupled to the conductive pad through an opening of the polymer layer.

In another exemplary aspect, a semiconductor structure is provided. The semiconductor structure includes: a metallization structure, a conductive pad, a passivation layer, and a protecting structure. The metallization structure has a dielectric surface. The conductive pad is on the dielectric surface. The passivation layer is on the dielectric surface and has a plurality of protrusion structures. The protecting structure covers the passivation layer.

In yet another exemplary aspect, a method for manufacturing a semiconductor structure is provided. The method includes the following operations. A metallization structure having a dielectric surface is provided. A conductive pad is formed on the dielectric surface. A first protecting structure is formed on the dielectric surface and be leveled with the conductive pad. A polymer layer is formed over the first protecting structure and the conductive pad.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a metallization structure having a dielectric surface;
a first protecting structure on the dielectric surface;
a conductive pad on the dielectric surface and leveled with the first protecting structure;
a passivation layer over the first protecting structure;
a second protecting structure over the passivation layer, and a portion of the first protecting structure is in contact with the second protecting structure;
a polymer layer over the first protecting structure, the passivation layer, the second protecting structure, and the conductive pad; and
a conductive bump electrically coupled to the conductive pad through an opening of the polymer layer.

2. The semiconductor structure of claim 1, further comprising a spacer between a sidewall of the conductive pad and the first protecting structure.

3. The semiconductor structure of claim 1, wherein a first portion of the first protecting structure is leveled with the conductive pad and a second portion of the first protecting structure is higher than the conductive pad.

4. The semiconductor structure of claim 1, wherein materials of the first protecting structure and the second protecting structure are substantially identical.

5. The semiconductor structure of claim 1, wherein the passivation layer is made of undoped silicate glass (USG) having a thickness in a range of from about 12000 Å to about 15000 Å.

6. The semiconductor structure of claim 1, wherein the metallization structure further having an extreme low-k (ELK) dielectric layer with a dielectric constant less than about 2.5.

7. The semiconductor structure of claim 2, wherein a height of the spacer is identical to a height of the conductive pad.

8. The semiconductor structure of claim 1, wherein the second protecting structure is thicker than the first protecting structure.

9. A method for manufacturing a semiconductor structure, comprising:
providing a metallization structure having a dielectric surface;
forming a conductive pad on the dielectric surface;
forming a spacer on a sidewall of the conductive pad;
forming a first protecting structure leveled with the conductive pad on the dielectric surface;
forming a passivation layer over the first protecting structure;
forming a second protecting structure over the passivation layer, and an edge of the first protecting structure is heightened by the spacer to in contact with the second protecting structure; and
forming a polymer layer over the first protecting structure and the conductive pad.

10. The method of claim 9, further comprising:
forming an opening through the second protecting structure and the polymer layer, and exposing the conductive pad; and
forming a conductive bump in the opening.

11. The method of claim 9, wherein the spacer is shaped by blanket-etching.

12. The method of claim 9, wherein the conductive bump having a copper bump and a flat bump surface covered by a solder paste.

13. The method of claim 9, wherein the second protecting structure is made of silicon nitride or silicon oxide.

14. A semiconductor structure, comprising:
a back end of line (BEOL) structure having a dielectric surface;
a conductive pad on the dielectric surface;
a spacer laterally surrounds the conductive pad;
a first protecting structure over the dielectric surface, the spacer, and a portion of the conductive pad;
a second protecting structure over the first protecting structure, and an edge of the first protecting structure is in contact with an edge of the second protecting structure over the conductive pad;
a polymer layer over the second protecting structure and the conductive pad; and
a conductive bump electrically coupled to the conductive pad through an opening of the polymer layer.

15. The semiconductor structure of claim 14, further comprising a passivation layer between the first protecting structure and the second protecting structure.

16. The semiconductor structure of claim 15, wherein the passivation layer is not overlap with the conductive pad from a top perspective view.

17. The semiconductor structure of claim 14, further comprising an under bump metallurgy (UBM) between the conductive bump and the polymer layer.

18. The semiconductor structure of claim 17, wherein a side of the polymer layer and a side of the UBM are in contact with a top surface of the conductive pad.

19. The semiconductor structure of claim 14, wherein a thickness of the first protecting structure is in a range of from about 2000 Å to about 3000 Å.

20. The semiconductor structure of claim 14, wherein the first protecting structure is sandwiched by extreme low-K dielectric materials.

* * * * *